United States Patent
Moriceau et al.

(10) Patent No.: US 8,470,712 B2
(45) Date of Patent: Jun. 25, 2013

(54) PROCESS FOR THE TRANSFER OF A THIN FILM COMPRISING AN INCLUSION CREATION STEP

(75) Inventors: Hubert Moriceau, Saint Egrève (FR); Michel Bruel, Veurey (FR); Bernard Aspar, Rives (FR); Christophe Maleville, La Terrasse (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/977,757

(22) Filed: Dec. 23, 2010

(65) Prior Publication Data

US 2011/0092051 A1    Apr. 21, 2011

Related U.S. Application Data

(60) Division of application No. 11/747,733, filed on May 11, 2007, now Pat. No. 7,883,994, which is a continuation of application No. 10/667,707, filed on Sep. 22, 2003, now Pat. No. 7,229,899, which is a continuation of application No. 09/380,322, filed as application No. PCT/FR98/02904 on Dec. 29, 1998, now Pat. No. 6,756,286.

(30) Foreign Application Priority Data

Dec. 30, 1997   (FR) ..................................... 97 16696

(51) Int. Cl.
H01L 21/302   (2006.01)
H01L 21/30    (2006.01)

(52) U.S. Cl.
USPC ........... 438/689; 438/458; 438/459; 438/495; 438/460

(58) Field of Classification Search
USPC ................................... 438/458–460, 495, 689
See application file for complete search history.

(56) References Cited

U.S. PATENT DOCUMENTS 3,901,423 A   8/1975  Hillberry et al.
3,915,757 A   10/1975 Engel (Continued)

FOREIGN PATENT DOCUMENTS

EP   0 355 913 A1   2/1990
EP   0 383 391 A1   8/1990

(Continued)

OTHER PUBLICATIONS

Agarwal, Aditya et al. "Efficient Production of Silicon-On-Insulator Films by Co-Implantation of He$^+$ with H$^+$"—Proceedings 1997 IEEE International SOI Conference, Oct. 1997—pp. 44-45.

(Continued)

*Primary Examiner* — Shamim Ahmed
(74) *Attorney, Agent, or Firm* — Brinks Hofer Gilson & Lione

(57) ABSTRACT

A process for transferring a thin film includes forming a layer of inclusions to create traps for gaseous compounds. The inclusions can be in the form of one or more implanted regions that function as confinement layers configured to trap implanted species. Further, the inclusions can be in the form of one or more layers deposited by a chemical vapor deposition, epitaxial growth, ion sputtering, or a stressed region or layer formed by any of the aforementioned processes. The inclusions can also be a region formed by heat treatment of an initial support or by heat treatment of a layer formed by any of the aforementioned processes, or by etching cavities in a layer. In a subsequent step, gaseous compounds are introduced into the layer of inclusions to form micro-cavities that form a fracture plane along which the thin film can be separated from a remainder of the substrate.

24 Claims, 4 Drawing Sheets

U.S. PATENT DOCUMENTS

| | | | |
|---|---|---|---|
| 3,957,107 A | 5/1976 | Altoz et al. |
| 3,993,909 A | 11/1976 | Drews et al. |
| 4,006,340 A | 2/1977 | Gorinas |
| 4,028,149 A | 6/1977 | Deines et al. |
| 4,039,416 A | 8/1977 | White |
| 4,074,139 A | 2/1978 | Pankove |
| 4,107,350 A | 8/1978 | Berg et al. |
| 4,108,751 A | 8/1978 | King |
| 4,121,334 A | 10/1978 | Wallis |
| 4,170,662 A | 10/1979 | Weiss et al. |
| 4,179,324 A | 12/1979 | Kirkpatrick |
| 4,244,348 A | 1/1981 | Wilkes |
| 4,252,837 A | 2/1981 | Auton |
| 4,254,590 A | 3/1981 | Eisele et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,500,563 A | 2/1985 | Ellenberger et al. |
| 4,508,056 A | 4/1985 | Bruel et al. |
| 4,536,657 A | 8/1985 | Bruel |
| 4,539,050 A | 9/1985 | Kramler et al. |
| 4,542,863 A | 9/1985 | Larson |
| 4,566,403 A | 1/1986 | Fournier |
| 4,567,505 A | 1/1986 | Pease |
| 4,568,563 A | 2/1986 | Jackson et al. |
| 4,585,945 A | 4/1986 | Bruel et al. |
| 4,630,093 A | 12/1986 | Yamaguchi et al. |
| 4,684,535 A | 8/1987 | Heinecke et al. |
| 4,704,302 A | 11/1987 | Bruel et al. |
| 4,717,683 A | 1/1988 | Parrillo et al. |
| 4,764,394 A | 8/1988 | Conrad |
| 4,832,253 A | 5/1989 | Kloucek et al. |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,887,005 A | 12/1989 | Rough et al. |
| 4,891,329 A | 1/1990 | Reisman et al. |
| 4,894,709 A | 1/1990 | Phillips et al. |
| 4,904,610 A | 2/1990 | Shyr |
| 4,920,396 A | 4/1990 | Shinohara et al. |
| 4,929,566 A | 5/1990 | Beitman |
| 4,931,405 A | 6/1990 | Kamijo et al. |
| 4,948,458 A | 8/1990 | Ogle |
| 4,952,273 A | 8/1990 | Popov |
| 4,956,698 A | 9/1990 | Wang |
| 4,960,073 A | 10/1990 | Suzuki et al. |
| 4,975,126 A | 12/1990 | Margail et al. |
| 4,982,090 A | 1/1991 | Wittmaack |
| 4,996,077 A | 2/1991 | Moslehi et al. |
| 5,013,681 A | 5/1991 | Godbey et al. |
| 5,015,353 A | 5/1991 | Hubler et al. |
| 5,034,343 A | 7/1991 | Rouse et al. |
| 5,036,023 A | 7/1991 | Dautremont-Smith et al. |
| 5,110,748 A | 5/1992 | Sarma |
| 5,120,666 A | 6/1992 | Gotou |
| 5,131,968 A | 7/1992 | Wells et al. |
| 5,138,422 A | 8/1992 | Fujii et al. |
| 5,198,371 A | 3/1993 | Li |
| 5,200,805 A | 4/1993 | Parsons et al. |
| 5,232,870 A | 8/1993 | Ito et al. |
| 5,234,535 A | 8/1993 | Beyer et al. |
| 5,242,863 A | 9/1993 | Xiang-Zheng et al. |
| 5,250,446 A | 10/1993 | Osawa et al. |
| 5,256,581 A | 10/1993 | Foerstner et al. |
| 5,259,247 A | 11/1993 | Bantien |
| 5,280,819 A | 1/1994 | Newkirk et al. |
| 5,300,788 A | 4/1994 | Fan et al. |
| 5,310,446 A | 5/1994 | Konishi et al. |
| 5,374,564 A | 12/1994 | Bruel |
| 5,400,458 A | 3/1995 | Rambosek |
| 5,405,802 A | 4/1995 | Yamagata et al. |
| 5,413,951 A | 5/1995 | Ohori et al. |
| 5,442,205 A | 8/1995 | Brasen et al. |
| 5,494,835 A | 2/1996 | Bruel |
| 5,524,339 A | 6/1996 | Gorowitz et al. |
| 5,539,241 A | 7/1996 | Abidi et al. |
| 5,559,043 A | 9/1996 | Bruel |
| 5,567,654 A | 10/1996 | Beilstein, Jr. et al. |
| 5,611,316 A | 3/1997 | Oshima et al. |
| 5,618,739 A | 4/1997 | Takahashi et al. |
| 5,622,896 A | 4/1997 | Knotter et al. |
| 5,633,174 A | 5/1997 | Li |
| 5,661,333 A | 8/1997 | Bruel et al. |
| 6,020,252 A | 2/2000 | Aspar et al. |
| 6,225,192 B1 | 5/2001 | Aspar et al. |
| 6,809,009 B2 | 10/2004 | Aspar et al. |
| 7,067,396 B2 | 6/2006 | Aspar et al. |
| RE39,484 E | 2/2007 | Bruel |
| 7,494,897 B2 | 2/2009 | Fournel et al. |
| 7,498,234 B2 | 3/2009 | Aspar et al. |
| 7,615,463 B2 | 11/2009 | Aspar et al. |
| 7,670,930 B2 | 3/2010 | Tauzin et al. |
| 7,713,369 B2 | 5/2010 | Aspar et al. |
| 7,772,087 B2 | 8/2010 | Nguyen et al. |
| 7,902,038 B2 | 3/2011 | Aspar et al. |
| 2006/0252229 A1 | 11/2006 | Joly et al. |
| 2006/0281212 A1 | 12/2006 | Moriceau et al. |
| 2007/0037363 A1 | 2/2007 | Aspar et al. |
| 2007/0281445 A1 | 12/2007 | Nguyen et al. |
| 2008/0254591 A1 | 10/2008 | Deguet et al. |
| 2009/0120568 A1 | 5/2009 | Deguet et al. |
| 2009/0130392 A1 | 5/2009 | Aspar et al. |
| 2009/0156016 A1 | 6/2009 | Di Cioccio |
| 2010/0025228 A1 | 2/2010 | Tauzin et al. |
| 2010/0167499 A1 | 7/2010 | Fournel et al. |
| 2010/0216294 A1 | 8/2010 | Rabarot et al. |
| 2010/0323497 A1 | 12/2010 | Fournel |

FOREIGN PATENT DOCUMENTS

| | | |
|---|---|---|
| EP | 0 410 679 A1 | 1/1991 |
| EP | 0 504 714 A2 | 9/1992 |
| EP | 0 533 551 A1 | 3/1993 |
| EP | 0 293 049 B1 | 9/1993 |
| EP | 0 660 140 A1 | 6/1995 |
| EP | 0 665 588 A1 | 8/1995 |
| EP | 0 703 609 A1 | 3/1996 |
| EP | 0 754 953 B1 | 1/1997 |
| EP | 0 786 801 A1 | 7/1997 |
| EP | 0 793 263 A2 | 9/1997 |
| EP | 0 801 419 A1 | 10/1997 |
| EP | 0 807 970 A1 | 11/1997 |
| EP | 0 717 437 B1 | 4/2002 |
| EP | 0 767 486 B1 | 1/2004 |
| FR | 2 558 263 A1 | 7/1985 |
| FR | 2 681 472 A1 | 3/1993 |
| FR | 2 725 074 A1 | 3/1996 |
| FR | 95 08882 | 6/1996 |
| FR | 2 736 934 A1 | 1/1997 |
| FR | 2 748 850 A1 | 11/1997 |
| FR | 2 748 851 A1 | 11/1997 |
| GB | 2 211 991 A | 7/1989 |
| JP | 53-104156 A | 9/1978 |
| JP | 58-031519 A | 2/1983 |
| JP | 59-054217 A | 3/1984 |
| JP | 61-129872 A | 6/1986 |
| JP | 62-265717 A | 11/1987 |
| JP | 101004013 | 1/1989 |
| JP | 01-128570 A | 5/1989 |
| JP | 01-169917 A | 7/1989 |
| JP | 08-017777 A | 1/1990 |
| JP | 04-199504 A | 7/1992 |
| JP | 07-254690 A | 10/1995 |
| JP | 07-302889 A | 11/1995 |
| JP | 08-133878 A | 5/1996 |
| JP | 09-213594 A | 8/1997 |
| JP | 09-307719 A | 11/1997 |
| WO | WO 02/084721 A1 | 10/2002 |
| WO | WO 02/084722 A1 | 10/2002 |

| | | |
|---|---|---|
| WO | WO 03/032384 A1 | 4/2003 |
| WO | WO 2004/044976 A1 | 5/2004 |
| WO | WO 2004/059711 A1 | 7/2004 |
| WO | WO 2004/064146 A1 | 7/2004 |
| WO | WO 2005/000733 A2 | 1/2005 |
| WO | WO 2005/019094 A1 | 3/2005 |
| WO | WO 2005/043615 A1 | 5/2005 |
| WO | WO 2007/020351 A1 | 2/2007 |
| WO | WO 2007/036631 A1 | 4/2007 |
| WO | WO 2007/110515 A2 | 10/2007 |
| WO | WO 2008/093008 A2 | 8/2008 |
| WO | WO 2009/087290 A1 | 7/2009 |

OTHER PUBLICATIONS

Ahn, K. Y., et al., "Growth, Shrinkage, and Stability of Interfacial Oxide Layers Between Directly Bonded Silicon Wafers", *Applied Physics A.*, vol. 50, 1990, pp. 85-94.

Alley et al., "Surface Roughness Modification of Interfacial Contacts in Polysilicon Microstructures", Proceedings of the $7^{th}$ International Conference on Solid-State Sensors and Actuators, *Transducers '93*, Pacifico, Yokohama Japan. Jun. 7-10, 1993, pp. 288-291.

Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods in Physics Research", *Nuclear Instruments and Methods in Physics Research* B36, (1989), 163-172.

Ascheron, C., "A Study of Proton Bombardment Induced Swelling of GaP Single Crystals", *Phys. stat. sol.* (a) 92, (1985), pp. 169-176.

Ascheron, C., "Gettering a Copper in Proton- and Helium-Bombarded Buried Regions of Gallium Phosphide", *Phys. stat. sol.* (a), vol. 106, 1988, pp. 73-79.

Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549-557.

Ascheron, C., "Proton Beam Modification of Selected AIIIBV Compounds", *Phys. stat. sol.* (a) 124, (1991), pp. 11.

Ascheron, C., "Swelling, Strain, and Radiation Damage of He+ Implanted GaP", *Phys. stat. sol.* (a) 96, 1986, pp. 555-562. (1986).

Asheron, C., "The Effect of Hydrogen Implantation Induced Stress on GaP Single Crystals", *Nuclear Instruments and Methods in Physics Research*, B28 (1987), pp. 350-359.

Aspar et al., Smart-Cut®: The basic fabrication process for UNIBOND® SOI wafers, *SEMI* 1996, pp. 37-46.

Aspar, B. "Basic Mechanisms Involved in the Smart-Cut Process", Jun. 1997, pp. 233-240.

Aspar, B. et al, "Characterization of SOI substrates: Application to Recent SIMOX and UNIBOND Wafers," *Electrochemical Society Proceedings*, vol. 96-3, pp. 99-111.

Aspar, B. et al, "Transfer of Structured and Patterned Thin Silicon Films Using the Smart-Cut Process", 1996, pp. 1985-1986.

Aspar, B. Et al., "Ultra Thin Buried Oxide Layers Formed by Low Dose SIMOX Processes", Proc. $6^{th}$ International Conference on SOI Technology and Devices, *Electro. Soc.*, vol. 94, No. 11, 1994, pp. 62.

Auberton-Herve, A. J. et al, "A New Sal Material: Smart-Cut", 1996, pp. 214-219.

Auberton-Herve, A.J. et al, "SOI Materials for ULSI Applications", *Semiconductor International*, Oct. 1995, 5 pps.

A. J. Auberton-Hervé, Silicon-On-Insulator, *European Semiconductor*, Mar. 1997, pp. 17 and 18.

Blöchl P.E. et al., First-Principles Calculations of Diffusion Coefficients: Hydrogen in Silicon, *Physical Review Letters*, vol. 64, No. 12, 1990, pp. 1401-1404.

Bruel, Michel, "Application of Hydrogen Ion Beams to Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-1641, col. 36, Part 1, No. 3B.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut—a new SOI Material Technology based on hydrogen Implantation and wafer bonding," *CEA*, 1996, 26 pages.

Bruel, M., "Silicon on insulator Material Technology", *Electronic Letters*; 31 Jul. 6, 1995; No. 14; pp. 1201-1202.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen in Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted in Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation in Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation—A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B in Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon," *J. Appl. Phys.*, 49(10), Oct. 1978, pp. 5188-5198.

Demeester, et al., "Epitaxial Lift-Off and Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

Di Cioccio, L. et al., "*Silicon Carbide on Insulator Formation by the Smart Cut® Process*".—Materials Science and Engineering B46 (1997)—(pp. 349-356).

DiCioccio, et al.,"Silicon carbide on Insulator formation using the Smart Cut process", *Electronics Letters*, vol. 32, No. 12, Jun. 6, 1996, pp. 144-145.

Diem et al., "SOI 'SIMOX': From Bulk to Surface Micromachining, A New Age for Silicon Sensors and Actuators", *Sensors and Actuators*, vol. A 46-47, 1995, pp. 8-16.

Dirks, A. G. et al., "Columnar Microstructure in Vapor DEuropesited Thin Films", *Thin Solid Films*, vol. 47, 1977, pp. 219-233.

Eaglesham, White, Feldman, Moriya and Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress in Surface Deformation of He-Implanted Surfaces" *Journal of Applied Physics*, vol. 48, No. 1, Jan. 1977, pp. 9-17.

Evans, J.H., "An Interbubble Fracture Mechanism of Blister Formation on Helium-Irradiated Metals" *Journal of Nuclear Materials*, 68, 1977, pp. 129-140.

Feijoo et al., "Prestressing of Bonded Wafers"—Proceedings of the First International Symposium on: Semiconductor Wafer Bonding: Science, Technology, and Applications—Electronics and Dielectric Science and Technology Divisions—Proceedings vol. 92-7—Copyright 1992 by The Electrochemical Society, Inc., (pp. 228-238).

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Garnier, D. M., "The Fabrication of a Partial Soi Substrate", Proceedings of the 9th International Symposium on Silicon on Isolator Technology and Devices, vol. 99, Chap. 54, 1990, 73-78.

Gerasimenko, N., "Infrared Absorption of Silicon Irradiated by Protons", *Phys. stat.sol.* (b) 90, (1978), pp. 689-695.

Ghandi, Sorab, "VLSI Fabrication Princiles—Silicon and Gallium Arsenide", *Rensselaer Polytechnic Institute*, 1983, John Wiley & Sons publishers, pp. 135.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization by Atomic Force Microscopy of the SOI Layer Topography in Low Dose SIMOX Materials", *Materials Science and Engineering*, B46, Apr. 1997, pp. 29-32.

Haisma et al., Silicon-on-Insulator Wafer Bonding—Wafer Thinning Technological Evaluations, *JAPANese Journal of Applied Physics*, 28, Aug. 1989, No. 8, Part 1, Tokyo, Japan, pp. 1426-1443.

Hamaguchi et al., "Device Layer Transfer Technique using Chemi-Mechanical Polishing", *JAPANese Journal of Applied Physics*, 23, Oct. 1984, No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

IBM Technical Disclosure Bulletin, *SOI Interposer Structure XP 000627972*, Jul. 1996, vol. 39 No. 7, pp. 1-5.

Jaussaud, C. et al., Microstructure of Silicon Implanted With High Dose Oxygen Ions, *Appl. Phys. Lett.*, vol. 48, No. 11, 1985, pp. 1064-1066.

Johnson, "High Fluence Deuteron Bombardment of Silicon", *Radiation Effects*, 1977, vol. 32, pp. 159-167.

Jones, K. S. et al., "A Systematic Analysis of Defects in Ion Implanted Silicon", *Applied Physics A.*, vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Klem, J.F., "Characteristics of Lift-Off Fabricated AlGaAs/InGaAs Single-Strained-Quantum Well Structures on Glass and Silicon Substrates", *Inst. Phys. Conf.* Ser. No. 96: Chapter 6, (1989), pp. 387-392.

Komarov et al., Crystallographic Nature and Formation Mechanisms of Highly Irregular Structure in Implanted and Annealed S1, Layers*Radiation Effects*, vol. 42, 1979, pp. 169-178.

Laporte A. et al., "Charged Defects At the Interface Between Directly Bonded Silicon Wafers"—Applied Physics, vol. 36 (Sep. 1997) pp. 5502-5506—Part 1, No. 9A.

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects 1976*, vol. 27, 1976, pp. 129-137.

Lu, X., et al., "SOI Material Technology Using Plasma Immersion ION Implantation", Proceedings 1996 IEEE International SOI Conference, Oct. 1996, pp. 48-49.

Maleville, C. et al, "Physical Phenomena involved in the Smart-Cut Process", *Electrochemical Society Proceeding*, vol. 96-3, 1996—pp. 34-46.

Maleville, C. et al, "Wafer Bonding and Hi-Implantation Mechanisms Involved in the Smart-Cut Technology", Apr. 1997, pp. 14-19.

Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.

Matsuda et al., "Large Diameter Ion Beam Implantation System," *Nuclear Instruments and Methods*, vol. B21, 1987, pp. 314-316.

Matsuo et al., "Abnormal solid solution and activation behavior in GA-implanted Si(100)", *Appl. Phys. Lett.*, vol. 51, No. 24, 1987, pp. 2037-2039.

Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.

Miyagawa, S. et al, "Helium Reemission During Implantation of Silicon Carbide", *J. Appl. Phys.*, 54 (5), May 1983, pp. 2302-2306.

Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Moriceau, H. et al. "Cleaning and Polishing As Key Steps for Smart-Cut SOI Process", Proceedings 1996 IEEE SOI Conference, Oct. 1996.

Moriceau, H. et al, "The Smart-Cut Process as a Way to Achieve Specific Film Thickness in Sal Structures", 1997, pages unknown.

Motohiro et al. "*Geometrical Factors of Argon Incorporation in $SiO_2$ Films Deposited by ION Beam Sputtering*"—Thin Solid Films, Elsevier-Sequoia S.A. Lausanne, CH, vol. 120, No. 4—Oct. 1, 1984, pp. 313-327.

Munteanu, D. et al, "Detailed Characterization of Unibond Material", 1997, pp. 395-398.

Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.

Nichols C. S et al., "Properties of Hydrogen in Crystalline Silicon Under Compression and Tension", *Physical Review Letters*, vol. 63, No. 10, 1989, pp. 1090-1093.

Nicoletti, S. et al., "Bi-Epitaxial YBCO Grain Boundry Josephson Junctions on SrTiO3 and Sapphire Substrates", *Physics C269*, 1996, pp. 255-267.

Ono et al., "Orientation Dependence of Flaking of Ion Irradiated Aluminum Single Crystals", *Japanese Journal of Applied Physics*, vol. 25, No. 10, 1986, pp. 1475-1480.

Paszti, E, "Flaking and Wave-Like Structure on Metallic Glasses Induced by MeV-Energy Helium Ions", *Nuclear Instruments and Methods*, vol. 209/210, (1983), pp. 273-280.

Picraux, S. Thomas et al., "Ion Implantation of Surfaces," *Scientific American*, vol. 252, No. 3, pp. 102-113 1985.

Pollentier, et al., "Fabrication of High-Radiance LEDs by Epitaxial Lift-Off", *SPIE*, vol. 1361, 1990, pp. 1056-1062.

Primak, W., "Impurity Effect in the Ionization Dilation of Vitreous Silica" *J. Appl. Phys.* 39(13) 1968.

Ray et al. "*Effect of Reactive-Ion Bombardment on the Properties of Silicon Nitride and Oxynitride Films Deposited by Ion-Beam Sputtering*"—Journal of Applied Physics, vol. 75, No. 12, Jun. 15, 1994—pp. 8145-8152.

Renier, M. et al., "A New Low-Energy Ion Implanter for Bombardment of Cylindrical Surfaces," *Vacuum*, vol. 35, No. 12, pp. 577-578, 1985.

Roth, J., "Blistering and Bubble Formation" *Inst. Phys. Conf.* Ser. No. 28, 1976: Chapter 7, pp. 280-293.

Sah, Chih-Tang et al., "Deactivation of the Boron Acceptor in Silicon by Hydrogen," *Appl. Phys. Lett.* 43, (2), Jul. 1983, pp. 204-206.

Saint-Jacques R. G., "La Formation des Cloques", *Nuclear Instruments and Methods*, No. 209/210, North Holland Publishing Co., 1983, pp. 333-343.

Shintani, A. et al., "Temperature dependence of stresses in chemical deposited vitreous films", *J. Appl. Phys.*, vol. 51, No. 8, 1980, pp. 4197.

Sioshansi, Piran, "Ion Beam Modification of Materials for Industry," *Thin Solid Film*, vol. 118, 1984, pp. 61-71.

Snyman, H. C., "Transmission Electron Microscopy of Extended Crystal Defects in Proton Bombarded and Annealed GaAs", *Radiation Effects*, 1983, vol. 69, pp. 199-230.

Snyman, H. C. et al, "Void Formation in Annealed Proton-Bombarded GaAs", 1981, pp. 243-245.

Stein, Myers and Follstaedt, "Infrared Spectroscopy of chemically bonded hydrogen at voids and defects in silicon", *J. Appl. Phys.* 73(b6), Mar. 15, 1993, pp. 2755-2764.

Stephen, D., "Investigation of Lattice Strain in Proton-Irradiated GaP by a Modified Auleytner Technique" *Phys. stat. sol.* (a) 87, 1985, pp. 589-596.

Suzuki et al., "High-Speed and Low Power n+-p+ Double-Gate SOI CMOS", *IEICE Trans. Electron.*, vol. E78-C, No. 4, 1995, pp. 360-367.

Sze, S.M., VLSI Technology, 2.sup.nd Ed., 1988, pp. 9-10.

Tan, T. Y. et al., "On Oxygen Precipitation Retardation/Recovery Phenomena, Nucleation Incubation Phenomena and the Exigent-Accomodation-Volume Factor of Precipitation", Proceedings of the 5$^{th}$ International Symposium on Silicon Materials Science and Technology, *Semiconductor Silicon 198 Electrochem. Soc.*, New Jersey, 1986, pp. 864-873.

Terada, K. et al., "A New Dram Cell With a Transistor on a Lateral Epitaxial Silicon Layer (Tole Cell)", *IEEE Transactions on Electron Device*, vol. 37, No. 9, 1990, pp. 2052-2057.

Theodore, N. David et al., TFSOI With Improved Oxidation Resistance (to Reduce Isolation Induced Stresses and Leakage), Motorola Bulletin XP 000691920, *Technical Developments*, Nov. 1996, pp. 158-159.

Timoshenko, S. et al., "Analysis of Bi-Metal Thermostats", *J. Opt. Soc. Am.*, vol. 11, 1925, pp. 233-256.

Tong et al., "Low Temperature SI Layer Splitting", Proceedings 1997 IEEE International SOI Conference, Oct. 1997, pp. 126-127.

Tonini, Monelli, Cornl, Ottaviani, Frabboni, Canteri, Queirolo, "Hydrogen Interaction with phosphorus ion implantated silicon", *Ion Implantation Technology—94*, (1995) pp. 801-804.

Tzeng, J.C., "A Novel Self-Aligned Oxgyen (Salox) Implanted SOI Mosfet Device Structure" *Nuclear Instruments and Methods in Physics Research* B2, 1987, pp. 112-115.

U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.

Van de Walle, C. "Theoretical Aspects of Hydrogen in Crystalline Semiconductors", *Physica B*, Holland, vol. 170, No. 15, 1991, pp. 21-32.

Van de Walle, C. "Theory of Hydrogen Diffusion and Reactions in Crystalline Silicon", *Physical Review Letters*, vol. 64, No. 6, 1980, pp. 669-672.

Van de Walle, C. "Theory of Hydrogen Diffusion and Reactions in Crystalline Silicon", *Physical Review B*, vol. 39, No. 15, 1989, pp. 10 791-10 808, plus diagrams.

Van Swijgenhoven et al. "Helium Bubble and Blister Formation for Nickel and an AMorphous Fe—Ni—Mo—B Alloy During 5 kev He-+-Irradiation at Temperatures Between 200 K and 600", *Nuclear Instruments and Methods*, 209/210, 1983, pp. 461-468.

Veldkamp, W.B. et al., "Binary Optics," *Scientific American*, 1992, pp. 50-55.

Wemple, S.H., "Optical and channeling studies of ion-bombarded GaP", *J. Appl. Phys.*, vol. 45, No. 4, Apr. 1974, pp. 1578-1588.

Whitton, J. L. et al., "The Collection of Ions Implanted in Semiconductors: 1 Saturations Effects", *Radiation Effects*, Scotland, vol. 16, 1972, pp. 101-105.

Williams J. et al., "Annealing behaviour of high-dose rare-gas implantations into silicon", from Application of Ion Beans to Materials, 1975, Chap. 1, *Inst. Phys. Conf.* Ser. No. 28, 1976, pp. 30-36.

Wittmaack et al., "High Fluence Retention of Noble Gases Implanted in Silicon" *Radiation Effects*, vol. 39, 1978, pp. 81-95.

Wolf, Stanley Ph.D., Silicon Processing for the VLSI Era (vol. 2), Lattice Press, 1990, pp. 66-79.

Yamaguchi H. et al., "Intelligent Power IC With Partial Soi Structure", *Jpn. J. Appl. Phys.*, vol. 34, 1995, pp. 864-868.

Yee et al., "Polysilicon Surface-Modification Technique to Reduce Sticking of Microstructures", *Sensors and Actuators* A 52, 1996, pp. 145-150.

International Search Report for International Application No. PCT/FR1998/002904, dated Apr. 16, 1999, 2 pages.

International Search Report for International Application No. PCT/FR2002/001266, dated Feb. 7, 2003, 4 pages.

International Search Report for International Application No. PCT/FR2002/001268, dated Feb. 6, 2003, 4 pages.

International Search Report for International Application No. PCT/FR2002/003422, dated Jan. 22, 2003, 3 pages.

International Search Report for International Application No. PCT/FR2003/003256, dated Mar. 19, 2004, 6 pages.

International Search Report for International Application No. PCT/FR2003/003867, dated May 28, 2004, 3 pages.

International Search Report for International Application No. PCT/FR2003/003622, dated Jun. 3, 2004, 3 pages.

International Search Report for International Application No. PCT/FR2004/001858, dated Dec. 28, 2004, 3 pages.

International Search Report for International Application No. PCT/FR2004/002779, dated Apr. 5, 2005, 3 pages.

International Search Report for International Application No. PCT/FR2004/002781, dated Apr. 5, 2005, 3 pages.

International Search Report for International Application No. PCT/FR2004/001565, dated Jul. 6, 2005, 3 pages.

International Search Report for International Application No. PCT/FR2006/001945, dated Jan. 8, 2007, 3 pages.

International Search Report for International Application No. PCT/FR2006/002184, dated Jan. 24, 2007, 2 pages.

International Search Report for International Application No. PCT/FR2007/000534, dated Nov. 22, 2007, 3 pages.

International Search Report for International Application No. PCT/FR2007/002100, dated Feb. 4, 2009, 3 pages.

International Search Report for International Application No. PCT/FR2008/001427, dated Jul. 1, 2009, 3 pages.

Office Action from U.S. Appl. No. 12/063,808, dated Apr. 6, 2010, 9 pages.

Office Action from U.S. Appl. No. 12/063,808, dated Sep. 22, 2010, 9 pages.

Office Action from U.S. Appl. No. 10/534,199, dated Feb. 19, 2009, 8 pages.

Office Action from U.S. Appl. No. 10/534,199, dated Aug. 5, 2009, 10 pages.

Office Action from U.S. Appl. No. 10/534,199, dated Jan. 20, 2010, 8 pages.

Office Action from U.S. Appl. No. 10/534,199, dated Aug. 4, 2010, 8 pages.

Office Action from U.S. Appl. No. 10/577,175, dated Jun. 22, 2009, 13 pages.

Office Action from U.S. Appl. No. 10/577,175, dated Apr. 13, 2010, 14 pages.

Office Action from U.S. Appl. No. 11/480,250, dated May 22, 2008, 10 pages.

Office Action from U.S. Appl. No. 11/480,250, dated Dec. 3, 2008, 16 pages.

Office Action from U.S. Appl. No. 11/480,250, dated Jan. 26, 2010, 14 pages.

Office Action from U.S. Appl. No. 11/480,250, dated Aug. 3, 2010, 15 pages.

Office Action from U.S. Appl. No. 12/088,047, dated Sep. 25, 2009, 9 pages.

Office Action from U.S. Appl. No. 12/088,047, dated Mar. 10, 2010, 9 pages.

Office Action from U.S. Appl. No. 10/561,299, dated Mar. 26, 2008, 9 pages.
Office Action from U.S. Appl. No. 10/561,299, dated Dec. 9, 2008, 11 pages.
Office Action from U.S. Appl. No. 10/561,299, dated May 11, 2009, 12 pages.
Office Action from U.S. Appl. No. 10/561,299, dated Nov. 16, 2009, 11 pages.
Office Action from U.S. Appl. No. 10/561,299, dated Nov. 27, 2009, 10 pages.
Office Action from U.S. Appl. No. 10/561,299, dated May 11, 2010, 11 pages.
Office Action from U.S. Appl. No. 10/565,621, dated May 15, 2007, 13 pages.
Office Action from U.S. Appl. No. 10/565,621, dated Feb. 11, 2008, 11 pages.
Office Action from U.S. Appl. No. 10/565,621, dated Sep. 12, 2008, 9 pages.
Office Action from U.S. Appl. No. 10/565,621, dated Mar. 12, 2009, 6 pages.
Office Action from U.S. Appl. No. 10/565,621, dated Jan. 7, 2010, 8 pages.
Office Action from U.S. Appl. No. 10/565,621, dated Nov. 23, 2010, 11 pages.
Office Action from U.S. Appl. No. 12/628,772, dated Oct. 7, 2010, 12 pages.
Office Action from U.S. Appl. No. 12/682,522, dated Mar. 29, 2011, 10 pages.
Notice of Allowance from U.S. Appl. No. 12/336,229, dated Sep. 29, 2010, 7 pages.
Notice of Allowance from U.S. Appl. No. 12/336,229, dated Jan. 10, 2011, 4 pages.
Office Action from U.S. Appl. No. 10/468,223, dated Oct. 5, 2005, 7 pages.
Office Action from U.S. Appl. No. 10/468,223, dated May 3, 2006, 11 pages.
Office Action from U.S. Appl. No. 10/468,223, dated Jan. 10, 2007, 11 pages.
Office Action from U.S. Appl. No. 10/468,223, dated Jul. 20, 2007, 11 pages.
Office Action from U.S. Appl. No. 10/468,223, dated Feb. 11, 2008, 11 pages.
Office Action from U.S. Appl. No. 10/468,223, dated Oct. 29, 2008, 11 pages.
Office Action from U.S. Appl. No. 10/468,223, dated Jun. 25, 2009, 8 pages.
Notice of Allowance from U.S. Appl. No. 10/468,223, dated Dec. 28, 2009, 4 pages.
Office Action from U.S. Appl. No. 10/474,984, dated Sep. 24, 2004, 6 pages.
Office Action from U.S. Appl. No. 10/474,984, dated Jun. 6, 2005, 5 pages.
Office Action from U.S. Appl. No. 10/474,984, dated Nov. 16, 2005, 5 pages.
Office Action from U.S. Appl. No. 10/474,984, dated May 17, 2006, 5 pages.
Office Action from U.S. Appl. No. 10/474,984, dated May 7, 2007, 9 pages.
Office Action from U.S. Appl. No. 10/474,984, dated Feb. 6, 2008, 10 pages.
Office Action from U.S. Appl. No. 10/474,984, dated Oct. 17, 2008, 11 pages.
Office Action from U.S. Appl. No. 10/474,984, dated Jul. 7, 2009, 10 pages.
Office Action from U.S. Appl. No. 10/474,984, dated Mar. 11, 2010, 13 pages.
Notice of Allowance from U.S. Appl. No. 10/474,984, dated Oct. 28, 2010, 6 pages.
Office Action from U.S. Appl. No. 10/540,303, dated Dec. 18, 2007, 6 pages.
Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No. 11/327,906, dated Sep. 15, 2008, 6 pages.
Office Action from U.S. Appl. No. 10/975,826, dated May 5, 2006, 14 pages.
Office Action from U.S. Appl. No. 10/975,826, dated Nov. 28, 2006, 20 pages.
Office Action from U.S. Appl. No. 10/975,826, dated Jul. 17, 2007, 21 pages.
Office Action from U.S. Appl. No. 10/975,826, dated Apr. 1, 2008, 27 pages.
Office Action from U.S. Appl. No. 10/975,826, dated Dec. 10, 2008, 28 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 6, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 16, 2009, 9 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities in Support of Soitec's Motion for Summary Judgment on Sigen's Enablement Invalidity Claim (Redacted) dated Mar. 27, 2001.
Soitec's Memorandum of Points and Authorities in Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment As a Matter of Law and a New Trial dated May 10, 2002.
Silicon Genesis Corporation's Opposition to Plaintiff's Motion for Judgment as a Matter of Law and a New Trial dated Jun. 17, 2002.

Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs-Appellants Soitec, S.A. and Commissariat a L'Energie Atomique dated Jan. 28, 2003.
Brief for Defendant-Cross Appellant Silicon Genesis Corporation dated Mar. 22, 2003.
Reply Brief of Plaintiffs-Appellants Soitec, S.A. and Commissariat a L'Energie Atomique dated May 5, 2003.
Reply Brief for Defendant-Cross Appellant Silicon Genesis Corporation dated May 19, 2003.
Plaintiff/Appellants Supplemental Authority Letter [dated Nov. 17, 2003].
Defendant-Cross Appellant's Response to Appellants' Submission of *CFMT, Inc.* v. *Yieldup Int'l*, [dated Nov. 24, 2003].
Decision from the United States Court of Appeals for the Federal Circuit dated Nov. 26, 2003.
Combined Petition for Panel Rehearing and for Rehearing En Banc by Plaintiffs-Appellant's Soitec, S.A. and Commissariat a L'Energie Atomique, dated Dec. 10, 2003.
Order [dated Jan. 7, 2004 denying Appellants' petition for panel rehearing and Appellant's petition for rehearing en banc].
Judgment Mandate [dated Jan. 14, 2004].
Complaint filed with Jury Demand against MEMC Electronic Materials Inc.—Magistrate Consent Notice to Pltf. ( Filing fee $ 350, receipt No. 152004.)—filed by SOITEC Silicon on Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).

Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Motion to Dismiss Based upon Fed. R. Civ. P. 12(b)(1) and (6) and Article III of the United States Constitution—filed by SOITEC Silicon on Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon on Insulator Technologies SA, Commissariat a LEnergie Atomique. (Attachments: # 1 Certificate of Service)(Kraft, Denise) (Entered: Apr. 7, 2009) (18 pgs).
Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).
Notice of by SOITEC Silicon on Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Stipulation and [Proposed] Order to File an Amended Complaint by SOITEC Silicon on Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request for Production of Documents and Things Directed to Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
First Amended Complaint for Patent Infringement against MEMC Electronic Materials Inc.—filed by SOITEC Silicon on Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).
Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).
Answer to 60 Answer to Amended Complaint, Counterclaim,,, Counterclaim *Reply to Defendant's Amended Counterclaims, Counterclaims and Affirmative Defenses* against MEMC Electronic Materials Inc. By SOITEC Silicon on Insulator Technologies SA, Commissariat a L'Energie Atomique, SOITEC U.S.A., Inc.. (Attachments: # 1 Certificate of Service)(Kraft, Denise) (Entered: Aug. 31, 2009).
Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).
Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).

Motion to Bifurcate *the Issues of Willfulness and Damages for Purposes of Discovery and Trial and proposed Form of Order*—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).
Opening Brief in Support re 77 Motion to Bifurcate *the Issues of Willfulness and Damages for Purposes of Discovery and Trial and proposed Form of Order* filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Cross Motion to Bifurcate *all Collateral Issues*—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross Motion to Bifurcate *all Collateral Issues*, 77 Motion to Bifurcate *the Issues of Willfulness and Damages for Purposes of Discovery and Trial and proposed Form of Order* filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Reply Brief re 77 Motion to Bifurcate *the Issues of Willfulness and Damages for Purposes of Discovery and Trial and proposed Form of Order* filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross Motion to Bifurcate *all Collateral* Issues filed by MEMC Electronic Materials Inc..Reply Brief due date per Local Rules is Dec. 3, 2009. (Rogowski, Patricia) (Entered: Nov. 19, 2009).
Reply Brief re 85 Cross Motion to Bifurcate *all Collateral Issues* filed by Commissariat a LEnergie Atomique, SOITEC Silicon on Insulator Technologies SA, SOITEC U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon on Insulator Technologies, S.A. and Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).
Motion for Leave to File *Stipulated Motion for Leave to File a Sur-Reply Brief in Support of MEMC's Motion to Bifurcate*—filed by MEMC Electronic Materials Inc.. (Attachments: # 1 Exhibit 1)(Rogowski, Patricia) (Entered: Dec. 14, 2009).
Sur-Reply Brief re 77 Motion to Bifurcate *the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial* filed by MEMC Electronic Materials Inc.. (Rogowski, Patricia) (Entered: Dec. 16, 2009).
Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).
Opening Brief in Support re 141 Motion for Discovery *Motion for the Admission of the Expert Testimony of John T. Goolkasian Relating to the Certificate of Corection for U.S. Patent No. 7,067,396* filed by MEMC Electronic Materials Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).
Answering Brief in Opposition re 141 Motion for Discovery *Motion for the Admission of the Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian* filed by SOITEC Silicon on Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,, *Declaration of Marcus T. Hall in Support of Plaintiff's Answering Brief in Opposition to Defendant's Motion for the Admission of Expert Testimony of John T. Goolkasian* by SOITEC Silicon on Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Reply Brief in *Support of 141 Motion for Discovery Motion for the Admission of the Expert Testimony of John T. Goolkasian Relating to the Certificate of Correction for U.S. Patent No. 7,067,396* filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Statement re 148 Stipulation *Joint Claim Construction Statement* by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Claim Construction Chart by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Sur-Reply Bried re 141 Motion for Discovery *Motion for the Admission of the Expert Testimony of John T. Goolkasian Relating to the Certificate of Correction for U.S. Patent No. 7,067,396 Surreply by Plaintiffs to Motion by Defendant for the Admission of Expert Testimony of John T. Goolkasian* filed by SOITEC Silicon on Insulator Technologies SA. (Attachments: # 1 Certificate of Service)(Kraft, Denise) (Entered: Jun. 15, 2010).
Declaration re 157 Sur-Reply Brief, *Declaration of Marcus T. Hall in Support of Surreply by Plaintiffs to Motion by Defendant for the Admissions of Expert Testimony of John T. Goolkasian* by SOITEC Silicon on Insulator Technologies SA. (Attachments: # 1 Exhibit A, # 2 Exhibit B, # 3 Exhibit C, # 4 Exhibit D, # 5 Certificate of Service)(Kaft, Denise) (Entered: Jun. 15, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113-DA0152, # 6 Appendix DA0153-DA0192, # 7 Appendix DA0193-DA0232, # 8 Appendix DA0233-DA0272, # 9 Appendix DA0273-DA0312, # 10 Appendix DA0313-DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).

Claim Construction Opening Brief *Plaintiffs S.O.I.TEC Silicon on Insulator Technologies, S.A. and Commissariat a L'Energie Atomique's Opening Claim Construction Brief* filed by Commissariat a LEnergie Atomique, SOITEC Silicon on Insulator Technologies SA. (Attachments: # 1 Certificate of Service)(Kraft, Denise) (Entered: Jun. 25, 2010).
Declaration re 168 Claim Construction Opening Brief, *Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Attachments: # 1 Certificate of Service)(Kraft, Denise) (Entered: Jun. 25, 2010).
Appendix re 167 Claim Construction Opening Brief,,,,,, by MEMC Electronic Materials Inc.. (Attachments: # 1 Appendix DA-0001-DA-0006, # 2 Appendix DA-0007-DA-0032, # 3 Appendix DA-0033-DA-0072, # 4 Appendix DA-0073-DA-0112, # 5 Appendix DA-0113-DA-0152, # 6 Appendix DA-0153-DA-0192, # 7 Appendix DA-0193-DA-0232, # 8 Appendix DA-0233-DA-0272, # 9 Appendix DA-0273-DA-0312, # 10 Appendix DA-0313-DA-0352, # 11 Appendix DA-0353-DA-0392, # 12 Appendix DA-0393-DA-0432, # 13 Appendix DA-0433-DA-0472, # 14 Appendix DA-0473-DA-0512, # 15 Appendix DA-0513-DA-0521)(Rogowski, Patricia) (Entered: Jun. 28, 2010).
Redacted Version of 175 Appendix by MEMC Electronic Materials Inc.. (Attachments: # 1 Appendix DA0522-DA0545, # 2 Appendix DA0546-DA0551, # 3 Appendix DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, # 11 Appendix DA0635, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).
Notice of filing the following document(s) in paper format: Joint Appendix of Exhibits to Opening and Answering Claim Construction Briefs (1) vol. I—JA0001 to JA0533. Appendix vol. I. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (2) vol. II—JA0534 to JA0930. Appendix vol. II. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010) (2 parts).
Notice of filing the following document(s) in paper format: Joint Appendix of Exhibits to Opening and Answering Claim Construction Briefs (4) vol. IV—JA1503 to JA1510. Appendix vol. IV. re 173 Notice of Filing Paper Documents, (Oversized Document, Item on File in the Clerks Office) (lid) (Entered: Jun. 28, 2010).
Notice of filing the following document(s) in paper format: Joint Appendix of Exhibits to Opening and Answering Claim Construction Briefs (5) vol. V—JA1511 to JA2089 (2 parts).
Vol. VI—JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010).
Motion in Limine *SOITEC/CEA Parties' Motion to Exclude the Expert Report of Dr. Pascal Belton and Any Related Testimony*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Motion for Partial Summary Judgment *of Invalidity of the Asserted Aspar Patent Claims*—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine *SOITEC/CEA Parties' Motion to Exclude the Expert Report of Dr. Pascal Bellon and Any Related Testimony* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgment *of Invalidity of the Asserted Aspar Patent Claims* filed by MEMC Electronic Materials Inc..Answering Brief/Response due date per Local Rules is Jul. 19, 2010. (Rogowski, Patricia) (Entered: Jul. 2, 2010).
Appendix re 186 Motion in Limine *SOITEC/CEA Parties' Motion to Exclude the Expert Report of Dr. Pascal Bellon and Any Related Testimony Plaintiffs' Omnibus Appendix to Daubert Motion and Motions for Partial Summary Judgment Filed on Jul. 2, 2010* by Commissariat a LEnergie Atomique, SOITEC Silicon on Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIX of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Motion for Summary Judgment *of Non-Infringement*—filed by MEMC Electronic Materials Inc.. (Attachments: # 1 Text of Proposed Order, # 2 Certificate of Service)(Rogowski, Patricia) (Entered: Jul. 2, 2010).
Motion for Partial Summary Judgment *SOITEC/CEA Parties Motion for Partial Summary Judgment That the Patents in Suit Satisfy the Written Description Requirement*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 202 Motion for Patrial Summary Judgment *SOITEC/CEA Parties Motion for Partial Summart Judgment That the Patents in Suit Satisfy the Written Description Requirement* filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment *Plaintiffs' Motion for Partial Summary Judgment That the Certificate of Correction for the '396 Patent is Valid*—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Bried in Support re 204 Motion for Partial Summary Judgment *Plaintiffs' Motion for Partial Summary Judgment That the Certificate of Correction for the '396 Patent is Valid* filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment *SOITEC/CEA Parties' Motion for Partial Summary Judgment That the Aspar Patents Are Not Invalid for Inequitable Conduct*—filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment *SOITEC/CEA Parties' Motion for Partial Summary Judgment That the Aspar Patents Are Not Invalid for Inequitable Conduct* filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).

Motion for Partial Summary Judgment *Plaintiffs' Motion for Partial Summary Judgment That the Bruel Patent Does Not Anticipate the Aspar Patents*—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).

Opening Brief in Support re 208 Motion for Partial Summary Judgment *Plaintiffs' Motion for Partial Summary Judgment That the Bruel Patent Does Not Anticipate the Aspar Patents* filed by Commissariat a LENergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).

Motion for Partial Summary Judgment *SOITEC's Motion for Partial Summary Judgment of Invalidity of United States Patent No. 5,834,812 for Lack of Enablement*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Opening Brief in Support re 210 Motion for Partial Summary Judgment *SOITEC's Motion for Partial Summary Judgment of Invalidity of United States Patent No. 5,834,812 for Lack of Enablement* filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).

Motion for Partial Summary Judgment *SOITEC's Motion for Partial Summary Judgment for Invalidity of Asserted Claims of United States Patent No. 5,834,812 in View of Prior Art*—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Motion for Partial Summary Judgment *That the Best Mode Requirement is Satisfied for the Claims of the '009 and '396 Patents*—filed by Commissariat a LEnergie Atomique, SOITEC Silicon on Insulator Technologies SA. (Attachments: # 1 Text of Proposed Order, # 2 Certificate of Service)(Reed, John) (Entered: Jul. 2, 2010).

Opening Brief in Support re 212 Motion for Partial Summary Judgment *SOITEC's Motion for Partial Summary Judgment for Invalidity of Asserted Claims of United States Patent No. 5,834,812 in View of Prior Art* filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).

Opening Brief in Support re 213 Motion for Partial Summary Judgment *That the Best Mode Requirement is Satisfied for the Claims of the '009 and '396 Patents* filed by SOITEC Silicon on Insulator Technologies SA.Answering Brief/Response due date per Local Rules is Jul. 19, 2010. (Attachments: # 1 Certificate of Service)(Reed, John) (Entered: Jul. 2, 2010).

Redacted Version of 200 Opening Brief in Support, by MEMC Electronic Materials Inc.. (Attachments: # 1 Certificate of Service)(Rogowski, Patricia) (Entered: Jul. 7, 2010).

Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 15 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate)(Rogowski, Patricia) (Entered: Jul. 7, 2010).

Redacted Version of 190 Appendix by MEMC Electronic Materials Inc.. (Attachments: # 1 Appendix MA0484-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0653, # 20 Appendix MA0654-MA0685, # 21 Appendix MA0686-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-MA0772, # 27 Appendix MA0773-MA0780, # 28 Appendix MA0781-MA0807, # 29 Appendix MA0808-MA0824, # 30 Appendix MA0825-MA0831.1, # 31 Appendix MA0832-MA0838, # 32 Appendix MA0839-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA0910-MA0931, # 41 Certificate of Service)(Rogowski, Patricia) (Entered: Jul. 7, 2010).

Redacted Version of 198 Opening Brief in Support,, *SOITEC/CEA Parties' Opening Brief in Support of Motion for Summary Judgment: Non-Infringement* by Commissariat a LEnergie Atomique, SOITEC Silicon on Insulator Technologies SA, SOITEC U.S.A., Inc.. (Kraft, Denise) (Entered: Jul. 8, 2010).

Redacted Version of 197 Sealed Motion for Summary Judgment *SOITEC/CEA Parties' Motion for Summary Judgment: Non-Infringement (Filed Under Seal)*Sealed Motion for Summary Judgment *SOITEC/CEA Parties' Motion for Summary Judgment: Non-Infringement (Filed Under Seal) SOITEC/CEA Parties' Motion for Summary Judgment: Non-Infringement* by Commissariat a LEnergie Atomique, SOITEC Silicon on Insulator Technologies SA, SOITEC U.S.A., Inc.. (Kraft, Denise) (Entered: Jul. 8, 2010).

Redacted Version of 192 Appendix, *Plaintiffs' Omnibus Appendix to Daubert Motion and Motions for Partial Summary Judgment* Filed on Jul. 2, 2010—vol. VI of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 193 Appendix, *Plaintiffs' Omnibus Appendix to Daubert Motion and Motions for Partial Summary Judgment* Filed on Jul. 2, 2010—vol. VIII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 194 Appendix, *Plaintiffs' Omnibus Appendix to Daubert Motion and Motions for Partial Summary Judgment* Filed on Jul. 2, 2010—vol. X of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 195 Appendix, *Plaintiffs' Omnibus Appendix to Daubert Motion and Motions for Partial Judgment* Filed on Jul. 2, 2010—vol. XVII of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 196 Appendix, *Plaintiffs' Omnibus Appendix to Daubert Motion and Motions for Partial Summary Judgment* Filed on Jul. 2, 2010—vol. XIX of XIX by Commissariat a LEnergie Atomique, SOITEC Silicon on Insulator Technologies SA, SOITEC U.S.A., Inc.. (Kraft, Denise) (Entered: Jul. 9, 2010).

Claim Construction Answering Brief re 168 Claim Construction Opening Brief, filed by MEMC Electronic Materials Inc.. (Attachments: # 1 Certificate of Service)(Rogowski, Patricia) (Entered: Jul. 9, 2010).

Appendix re 228 Claim Construction Answering Brief by MEMC Electronic Materials Inc.. (Attachments: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).

Claim Construction Answering Brief re 168 Claim Construction Opening Brief, 228 Claim Construction Answering Brief *Plaintiffs S.O.I.TEC on Insulator Technologies, S.A. and Commissariat a Energie Atomique's Answering Claim Construction Brief* filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 9, 2010).

Appendix re 230 Claim Construction Answering Brief, *Appendix to Plaintiffs S.O.I.TEC on Insulator Technologies, S.A. and Commissariat a Energie Atomique's Answering Claim Construction Brief* by Commissariat a LEnergie Atomique, SOITEC Silicon on Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).

Redacted Version of 183 Appendix, *Joint Appendix of Exhibits to Opening and Answering Claim Construction Briefs* vol. IV of VI by Commissariat a LEnergie Atomique, SOITEC Silicon on Insulator Technologies SA. (Kraft, Denise) (entered: Jul. 12, 2010).

Redacted Version of 170 Exhibit to a Document, *Exhibit A to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Redacted Version of 171 Exhibit to a Document, *Exhibit B to Declaration of Marcus T. Hall in Support of Plaintiffs S.O.I.TEC Silicon on Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Redacted Version of 172 Exhibit to a Document, *Exhibit C to Declaration of Marcus T. Hall in Support of Plaintiffs S.O.I.TEC Silicon on in Insulator Technologies, S.A. and Commissariat a L'Energie Atomique's Opening Claim Construction Brief* by Commissariat a LEnergie Atomique, SOITEC Silicon on Insulator Technologies SA. (Kraft, Denise) (Entered: Jul. 12, 2010).

Answering Brief in Opposition re 186 Motion in Limine *SOITEC/CEA Parties' Motion to Exclude the Expert Report of Dr. Pascal Bellon and Any Related Testimony* filed by MEMC Electronic Materials Inc..Reply Brief due date per Local Rules is Jul. 29, 2010. (Rogowski, Patricia) (Entered: Jul. 19, 2010).

Answering Brief in Opposition re 208 Motion for Partial Summary Judgment *Plaintiffs' Motion for Partial Summary Judgment That the Bruel Patent Does Not Anticipate the Aspar Patents* filed by MEMC Electronic Materials Inc..Reply Brief due date per Local Rules is Jul. 29, 2010. (Rogowski, Patricia) (Entered: Jul. 19, 2010).

Answering Brief in Opposition re 202 Motion for Partial Summary Judgment *SOITEC/CEA Parties Motion for Partial Summary Judgment That the Patents in Suit Satisfy the Written Description Requirement* filed by MEMC Electronic Materials Inc..Reply Brief due date per Local Rules is Jul. 29, 2010. (Rogowski, Patricia) (Entered: Jul. 19, 2010).

Answering Brief in Opposition re 204 Motion for Partial Summary Judgment *Plaintiffs' Motion for Partial Summary Judgment That the Certificate of Correlation for the '396 Patent is Valid* filed by MEMC Electronic Materials Inc..Reply Brief due date per Local Rules is Jul. 29, 2010. (Rogowski, Patricia) (Entered: Jul. 19, 2010).

Answering Brief in Opposition re 210 Motion for Partial Summary Judgment *SOITEC's Motion for Partial Summary Judgment of Invalidity of United States Patent No. 5,834,812 for Lack of Enablement* filed by MEMC Electronic Materials Inc..Reply Brief due date per Local Rules is Jul. 29, 2010. (Rogowski, Patricia) (Entered: Jul. 19, 2010).

Answering Brief in Opposition re 212 Motion for Partial Summary Judgment *SOITEC's Motion for Partial Summary Judgment for Invalidity of Asserted Claims of United States Patent No. 5,834,812 in View of Prior Art* filed by MEMC Electronic Materials Inc..Reply Brief due date per Local Rules is Jul. 29, 2010. (Rogowski, Patricia) (Entered: Jul. 19, 2010).

Appendix re 247 Answering Brief in Opposition,, *Appendix to Plaintiffs' Answering Brief in Opposition to Defendant's Motion for Partial Summary Judgment of Invalidity of the Asserted Aspar Claims* (PA-1103-PA-1156) by Commissariat a LEnergie Atomique, SOITEC Silicon on Insulator Technologies SA. (Attachments: # 1 Exhibit PA-1103-PA-1109—Filed Under Seal, # 2 Exhibit PA-1110-PA-1118—Filed Under Seal, # 3 Exhibit PA-1119-PA-1130—Filed Under Seal, # 4 Exhibit PA-1131-PA-1143—Filed Under Seal, # 5 Exhibit PA-1144-PA-1156, # 6 Certificate of Service)(Kraft, Denise) (Entered: Jul. 19, 2010).

Appendix re 250 Amswering Bried in Opposition, *Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Attachments: # 1 Exhibit PA-1190-PA-1191, # 2 Certificate of Service)(Kraft, Denise) (Entered: Jul. 19, 2010).

Redacted Version of 241 Answering Brief in Opposition, *to Plaintiffs' Motion for Partial Summary Judgment that the Best Mode Requirement is Satisfied for the Claims of the '009 and '396 Patents* by MEMC Electronic Materials Inc.. (Rogowski, Patricia) (Entered: Jul. 26, 2010).

Redacted Version of 249 Answering Bried in Opposition, *to Plaintiffs' Motion for Summary Judgment on the Infringement of U.S. Patent No. 5,834,812* by MEMC Electronic Materials Inc.. (Rogowski, Patricia) (Entered: Jul. 26, 2010).

Redacted Version of 253 Answering Brief in Opposition, *to Plaintiffs' Motion for Partial Summary Judgment that the Aspar Patents Are Not Invalid for Inequitable Conduct* by MEMC Electronic Materials Inc.. (Rogowski, Patricia) (Entered: Jul. 26, 2010).

Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA1265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127, # 12 Appendix MA2128-MA2206, # 13 Appendix MA2207-MA2253, # 14 Appendix MA2254-MA2273, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010) (2 parts).

Redacted Version of 261 Answering Brief in Opposition, *to Plaintiffs' Motion for Partial Summart Judgment that the Best Mode Requirement is Satisfied for the Claims of the '009 and '396 Patents (Corrected Version of D.I. 241)* by MEMC Electronic Materials Inc.. (Rogowski, Patricia) (Entered: Jul. 26, 2010).

Redacted Version of 250 Answering Brief in Opposition, *to Soitec's Brief in Opposition to Defendant's Motion for Summary Judgment of Non-Infringement* by Commissariat a LEnergie Atomique, SOITEC Silicon on Insulator Technologies SA. (Attachments: # 1 Certificate of Service)(Kraft, Denise) (Entered: Jul. 26, 2010).

Redacted Version of 247 Answering Brief in Opposition,, *to Plaintiffs' Answering Brief in Opposition to Defendant's Motion for Partial Summary Judgment of in validity of the Asserted Aspar Claims* by Commissariat a LEnergie Atomique, SOITEC Silicon on Insulator Technologies SA. (Attachments: # 1 Certificate of Service)(Kraft, Denise) (Entered: Jul. 26, 2010).

Redacted Version of 254 Appendix,, *to Appendix to Plaintiffs' Answering Brief in Opposition to Defendant's Motion for Partial Summary Judgment of Invalidity of the Asserted Aspar Claims* (PA-1103-PA-1143 by Commissariat a LEnergie Atomique, SOITEC Silicon on Insulator Technologies SA. (Kraft, Denise) (Entered: Jul. 26, 2010).

Redacted Version of 251 Appendix,, *to Appendix to Plaintiffs' Answering Brief in Opposition to Defendant's Motion for Summary Judgment of Non-Infringement* by Commissariat a LEnergie Atomique, SOITEC Silicon on Insulator Technologies SA. (Kraft, Denise) (Entered: Jul. 26, 2010).

Reply Brief re 204 Motion for Partial Summary Judgment *Plaintiffs' Motion for Partial Summary Judgment That the Certificate of Correction for the '396 Patent is Valid Reply Brief in Support of Plaintiffs' Motion for Partial Summary Judgment That the Certificate of Correction for the '396 Patent is Valid* filed by Commissariat a LEnergie Atomique, SOITEC Silicon on Insulator Technologies SA. (Attachments: # 1 Certificate of Service)(Kraft, Denise) (Entered: Jul. 30, 2010).

Declaration re 268 Reply Brief, *Declaration of Marcus T. Hall in Support of Reply Brief in Support of Plaintiffs' Motion for Partial Summary Judgment That the Certificate of Correction for the '396 Patent is Valid* by Commissariat a LEnergie Atomique, SOITEC Silicon on Insulator Technologies SA. (Attachments: # 1 Exhibit A, # 2 Certificate of Service)(Kraft, Denise) (Entered: Jul. 30, 2010).
Appendix re 268 Reply Brief, *Omnibus Appendix to Plaintiffs' Reply Briefs in Support of Plaintiffs' Daubert Motion and Motions for Partial Summary Judgment* (PA-1192-PA-1261) by Commissariat a LEnergie Atomique, SOITEC Silicon on Insulator Technologies SA. (Attachments: # 1 Exhibit PA-1199-PA-1204, # 2 Exhibit PA-1205-PA-1206, # 3 Exhibit PA-1206.1, # 4 Exhibit PA-1231-PA-1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).
Reply Brief re 210 Motion for Partial Summary Judgment *SOITEC's Motion for Partial Summary Judgment of Invalidity of United States Patent No. 5,834,812 for Lack of Enablement Reply Brief in Support of SOITEC's Motion for Partial Summary Judgment of Invalidity of United States Patent No. 5,834,812 for Lack of Enablement* filed by SOITEC Silicon on Insulator Technologies SA, SOITEC U.S.A., Inc., (Attachments: # 1 Certificate of Service)(Kraft, Denise) (Entered: Jul. 30, 2010).
Reply Brief re 212 Motion for Partial Summary Judgment *SOITEC's Motion for Partial Summary Judgment For Invalidity of Asserted Claims of United States Patent No. 5,834,812 in View of Prior Art Reply Brief in Support of SOITEC's Motion for Partial Summary Judgment for Invalidity of Asserted Claims of United States Patent No. 5,834,812 in View of Prior Art* filed by SOITEC Silicon on Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).
Reply Brief re 202 Motion for Partial Summary Judgment *SOITEC/CEA Parties Motion for Partial Summary Judgment That the Patents in Suit Satisfy the Written Description Requirement Reply Brief in Support of SOITEC/CEA Parties' Motion for Partial Summary Judgment That the Patents in Suit Satisfy the Written Description Requirement* filed by Commissariat a LEnergie Atomique, SOITEC Silicon on Insulator Technologies SA. (Attachments: # 1 Certificate of Service)(Kraft, Denise) (Entered: Jul. 30, 2010).
Redacted Version of 269 Appendix, *to Reply Brief in Support of MEMC's Motion for Partial Summary Judgment of Invalidity of the Asserted Aspar Patent Claims* by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).
Redacted Version of 273 Appendix *Reply Brief in Support of MEMC's Motion for Summary Judgment of Non-Infringement* by MEMC Electronic Materials Inc.. (Attachments: # 1 Appendix Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430, # 12 Appendix MA2431-MA2440, # 13 Appendix MA2441-MA2448, # 14 Appendix MA2449-MA2452, # 15 Appendix MA2452.1-MA2452.9, # 16 Certificate of Service)(Rogowski, Patricia) (Entered: Aug. 3, 2010).
Redacted Version of 267 Reply Brief in *Support of MEMC's Motion for Partial Summary Judgment of Invalidity of the Asserted Aspar Patent Claims* by MEMC Electronic Materials Inc.. (Rogowski, Patricia) (Entered: Aug. 3, 2010).
Redacted Version of 271 Reply Brief *in Support of MEMC's Motion for Summary Judgment of Non-Infringement* by MEMC Electronic Materials Inc.. (Rogowski, Patricia) (Entered: Aug. 3, 2010).
Redacted Version of 274 Appendix,, Omnibus Appendix to Plaintiffs' Reply Briefs in Support of Plaintiffs' Daubert Motion and Motions for Partial Summary Judgment (PA-1192-PA-1198 and PA-1207-PA-1230 Filed Under Seal) by Commissariat a LEnergie Atomique, SOITEC Silicon on Insulator Technologies SA. (Kraft, Denise) (Entered: Aug. 6, 2010).
Redacted Version of 277 Reply Brief, in Support of SOITEC/CEA Parties' Motion to Exclude the Expert Report of Dr. Pascal Bellon and Any Related Testimony by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 278 Reply Brief,, in Support of SOITEC/CEA Parties' Motion for Summary Judgment: Non-Infringement (Field Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 279 Reply Brief in Support of Plaintiffs' Motion for Partial Summary Judgment That the Best Mode Requirement is Satisfied for the Claims of the '009 and '396 Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 281 Reply Brief, in Suport of Plaintiffs' Motion for Partial Summary Judgment That the Bruel Patent Does Not Anticipate the Aspar Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 282 Reply Brief,, in Support of SOITEC/CEA Parties' Motion for Partial Summary Judgment That the Aspar Patents Are Not Invalid for Inequitable Conduct (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Notice of Service of CD of documents MEMC0782194-MEMC0782500 and FH-1 0001-FH-8 0067 by MEMC Electronics Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, SOITEC Silicon on Insulator Technologies SA. (Attachments: # 1 Certificate of Service)(Kraft, Denise) (Entered: Sep. 24, 2010).
Redacted Version of 303 Exhibit to a Document Exhibit A to Michael L. Bordy in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 304 Exhibit to a Document Exhibit B to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 305 Exhibit to a Document Exhibit C to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 306 Exhibit to a Document Exhibit D to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Proposed Pretrial Order [Proposed] Joint Pretrial Order (Filed Under Seal) by Commissariat a LEnergie Atomique, SOITEC Silicon on Insulator Technologies SA, SOITEC U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 7, 2010).
Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # Certificate of Service)(Rogowski, Patricia) (Entered: Oct. 8, 2010).

Proposed Voir Dire by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon on Insulator Technologies SA, SOITEC U.S.A., Inc.. (Kraft, Denise) (Entered: Oct. 8, 2010).
Redacted Version of 315 Proposed Pretrial Order,, Redacted Version of [Proposed] Joint Pretrial Order by Commissariat a LEnergie Atomique, SOITEC Silicon on Insulator Technologies SA, SOITEC U.S.A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).
Memorandum Opinion. Signed by Judge Sue L. Robinson on Oct. 13, 2010. (nmf) (Entered: Oct. 13, 2010).
Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Patial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).
Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be stricken from the record. (These filings, formerly D.I. Nos. 318 and 323 have been deleted from the docket.) (nmf) (Entered: Oct. 14, 2010).
Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Patial Summary Judgment; denying 212 Motion for Partial Summary Judgment; *granting* 213 Motion for Partial Summay Judgment. Signed by Judge Sue L. Robinson on Oct. 14, 2010. (nmf) (Entered: Oct. 14, 2010) Minute Entry for proceedings held before Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).
Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 18, 2010).
Second Amended Order re: 325 denying 141 Motion for Discovery; denying 186 Motion in Limine; granting in part and denying in part 187 Motion for Partial Summart Judgment; granting 197 Motion for Summary Judgment ; granting 199 Motion for Summary Judgment **with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmf) (Entered: Oct. 19, 2010).

Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).
Stipulation MEMC's Declaratory Judgment counterclaim asserting invalidity of United States Reissued Patent No. 39,484 in Civil Action No. 1:08-292-SLR is dismissed without prejudice by Commissariat a LEnergie Atomique, SOITEC Silicon on Insulator Technologies SA, SOITEC U.S.A., Inc.. (Kraft, Denise) (nmf, ). (Entered: Oct. 21, 2010).
Stipulation of Fact re 331 Memorandum and Order, 327 Memorandum and Order, 325 Memorandum Opinion by Commissariat a LEnergie Atomique, SOITEC Silicon on Insulator Technologies SA, SOITEC U.S.A., Inc.. (Kraft, Denise) (Entered: Oct. 21, 2010).
Letter to The Honorable Sue L. Robinson from Denise Seastone Kraft regarding Mutually agreed upon narrowing of the issues for trial—re 333 Stipulation, 332 Stipulation,. (Kraft, Denise) (Entered: Oct. 21, 2010) Correcting Entry: The pdf of D.I. 332 has been replaced with the correct pdf of the stipulation per request of filer. (nmf) (Entered: Oct. 22, 2010) So Ordered, re 333 Stipulation filed by SOITEC Silicon on Insulator Technologies SA, SOITEC U.S.A., Inc., Commissariat a LEnergie Atomique, 332 Stipulation, filed by SOITEC Silicon on Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).
Voir Dire Questions. Read in Open Court Oct. 25, 2010.(nmf) (Entered: Oct. 25, 2010).
Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).
Plaintiff's Bench Memorandum. Filed in Court Oct. 26, 2010. (nmf) (Entered: Oct. 26, 2010) Minute Entry for proceedings held before Judge Sue L. Robinson—Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson—Jury Trial—Day 3, held on Oct. 27, 2010. (Court Reporter Valerie Gunning/Kevin Maurer.) (nms) (Entered: Oct. 27, 2010).
Statement—Bench Memorandum Supporting MEMC's Proffer of Admissions by SOITEC in Prior Lawsuit Involving the '564 Patent submitted at trial by MEMC Electronic Materials Inc.. (Attachments: # 1 Exhibit A)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 1, 2010).
Final Jury Instructions read in open Court by Judge Robinson. (lid) (Entered: Nov. 1, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).
Redacted Version of 342 Jury Verdict. (lid) (Entered: Nov. 2, 2010).
Statement Bench Memorandum in Support of Plaintiffs' Motion for Judgment as a Matter of Law of No Unenforceability of the '009 Patent Due to Inequitable Conduct submitted at trial by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 2, 2010).
Answering Brief in Opposition re 301 Sealed Motion for Reconsideration Request to Modify Protective Order (MEMC's Opposition to Plaintiffs' Motion for Reargument Re: Modification of the Protective Order) filed by MEMC Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).
Judgment in favor of defendant MEMC Electronic Materials, Inc. and against plaintiffs S.O.I.TEC Silicon on Insulator Technologies, S.A. and Commisseriat a LEnergie Atomique et aux Energies Alternatives as to the 812 patent. It Is Further Ordered that judgment be and is hereby entered in favor of plaintiffs S.O.I.TEC Silicon on Insulator Technologies, S.A. and Commisseriat a LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).
Stipulation Setting Post-Trial Briefing Schedule re 348 Judgment,, by Commissariat a LEnergie Atomique, MEMC Electronic Materials Inc., SOITEC Silicon on Insulator Technologies SA. (Rogowski, Patricia) (Entered: Nov. 15, 2010).
Motion for Reargument re 348 Judgment,, (MEMCs Motion for Reargument of the Courts Order Re: The Unenforceability of the 009 Patent)—filed by MEMC Electronic Materials Inc.. (Attachments: # 1 Exhibit 1)(Rogowski, Patricia) (Entered: Nov. 16, 2010) So Ordered—re 349 Stipulation. Set Post Trial Briefing Schedule: (Opening Brief due Dec. 8, 2010., Answering Brief due Dec. 29, 2010., Reply Brief due Jan. 12, 2010.). Signed by Judge Sue L. Robinson on Nov. 17, 2010. (lid) (Entered: Nov. 17, 2010).
Motion for Leave to File Reply in Support of Plaintiff's Motion for Reargument—filed by Commissariat a LEnergie Atomique, SOITEC Silicon on Insulator Technologies SA. (Attachments: # 1 Text of Proposed Order, # 2 Certificate of Service)(Kraft, Denise) (Entered: Nov. 23, 2010).
Opening Brief in Support re 301 Sealed Motion for Reconsideration Request to Modify Protective Order, 351 Motion for Leave to File Reply in Support of Plaintiff's Motion for Reargument filed by Commissariat a LEnergie Atomique, SOITEC Silicon on Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).
Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 24, 2010) So Ordered—re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).
Stipulation to Extend Time to file Motions and Opening Post-Trial Briefs to Dec. 13, 2010—filed by Commissariat a LEnergie Atomique, SOITEC Silicon on Insulator Technologies SA, SOITEC U.S.A., Inc.. (Kraft, Denise) (Entered: Dec. 3, 2010).
Reply Brief re 350 Motion for Reargument re 348 Judgment (MEMCs Motion for Reargument of the Courts Order Re: The Unenforceability of the 009 Patent) Plaintiffs' Opposition to MEMC's Motion for Reargument of the Court's Order Re: The Unenforceability of the '009 Patent filed by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Dec. 3, 2010) So Ordered—re 354 Stipulation to Extend Time. Set Briefing Schedule: (Post Trial Opening Brief due Dec. 13, 2010.). Signed by Judge Sue L. Robinson on Dec. 6, 2010. (lid) (Entered: Dec. 6, 2010).
Exhibit re 355 Reply Brief, Exhibit B to Plaintiffs' Opposition to MEMC's Motion for Reargument of the Court's Order Re: The Uneforceability of the '009 Patent by Commissariat a LEnergie Atomique, SOITEC Silicon on Insulator Technologies SA, SOITEC U.S.A., Inc., (Kraft, Denise) (Entered: Dec. 6, 2010).
Answering Brief in Opposition re 351 Motion for Leave to File Reply in Support of Plaintiff's Motion for Reargument filed by MEMC Electronic Materials Inc..Reply Brief due date per Local Rules is Dec. 20, 2010. (Rogowski, Patricia) (Entered: Dec. 10, 2010).
Stipulation to Extend Time Stipulation and Order for Plaintiffs to file Motions and Opening Post-Trial Briefs to Dec. 14, 2010—filed by Commissariat a LEnergie Atomique, SOITEC Silicon on Insulator Technologies SA, SOITEC U.S.A., Inc.. (Kraft, Denise) (Entered: Dec. 13, 2010).
Motion for Judgment as a Matter of Law—MEMC's Renewed Motion for Judgment as a Matter of Law or in the Alternative for a New Trial—filed by MEMC Electronic Materials Inc.. (Rogowski, Patricia) (Entered: Dec. 13, 2010).
Opening Brief in Support re 359 Motion for Judgment as a Matter of Law—MEMC's Renewed Motion for Judgment as a Matter of Law or in the Alternative for a New Trial filed by MEMC Electronic Materials Inc..Answering Brief/Response due date per Local Rules is Dec. 30, 2010. (Attachments: # 1 Exhibit 1, # 2 Certificate of Service)(Rogowski, Patricia) (Entered: Dec. 13, 2010).
Motion for Judgment as a Matter of Law Plaintiffs' Renewed Motion for Judgment as a Matter of Law or in the Alternative for a New Trial—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Opening Brief in Support re 361 Motion for Judgment as a Matter of Law Plaintiffs' Renewed Motion for Judgment as a Matter of Law or in the Alternative for a New Trial filed by Commissariat a LEnergie Atomique, SOITEC Silicon on Insulator Technologies SA.Answering Brief/Response due date per Local Rules is Jan. 3, 2011. (Attachments: # 1 Certificate of Service)(Kraft, Denise) (Entered: Dec. 14, 2010).
Motion for Injunctive Relief Plaintiffs' Motion for Injunctive Relief and to Lift Stay on Damages Discovery—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered—re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).
Stipulation to Extend Time Post-Trial Answering Briefs to Jan. 12, 2011—filed by MEMC Electronic Materials Inc.. (Rogowski, Patricia) (Entered: Jan. 6, 2011).
Notice of Appearance by Aleine Michelle Porterfield on behalf of Commissariat a LEnergie Atomique, SOITEC Silicon on Insulator Technologies SA, SOITEC U.S.A., Inc. (Attachments: # 1 Certificate of Service)(Porterfield, Aleine) (Entered: Jan. 7, 2011).
Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).
Answering Brief in Opposition re 359 Motion for Judgment as a Matter of Law6—*MEMC'S Renewed Motion for Judgment as a Matter of Law or in the Alternative for a New Trial* filed by Commissariat a LEnergie Atomique, SOITEC Silicon on Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).
Answering Brief in Opposition re 361 Motion for Judgment as a Matter of Law *Plaintiffs' Renewed Motion for Judgment as a Matter of Law or in the Alternative for a New Trial (MEMCs Answering Brief in Opposition to Plaintiffs Renewed Motion for Judgment as a Matter of Law or in the Alternative for a New Trial)* filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).
Declaration re 378 Answering Brief in Opposition, (*Declaration of Robert M. Evans, Jr. in Support of MEMCs Opposition to Plaintiffs Renewed Motion for Judgment as a Matter of Law or in the Alternative for a New Trial*) by MEMC Electronic Materials Inc.. (Attachments: # 1 Exhibit 1, # 2 Exhibit 2, # 3 Certificate of Service)(Rogowski, Patricia) (Entered: Jan. 14, 2011).
Redacted Version of 376 Answering Brief in Opposition, *to Plaintiffs' Motion for Injunctive Relief and to Lift Stay on Damages Discovery* by MEMC Electronic Materials Inc.. (Attachments: # 1 Certificate of Service)(Rogowski, Patricia) (Entered: Jan. 20, 2011).
Redacted Version of 377 Appendix *to MEMC's Answering Brief in Opposition to Plaintiffs' Motion for Injunctive Relief and to Lift Stay on Damages Discovery* by MEMC Electronic Materials Inc.. (Attachments: # 1 Exhibit 1-7, # 2 Exhibit 8, # 3 Exhibit 9, # 4 Exhibit 10, # 5 Exhibit 11, # 6 Exhibit 12-13, # 7 Exhibit 14, # 8 Exhibit 15, # 9 Exhibit 16, # 10 Exhibit 17, # 11 Exhibit 18, # 12 Exhibit 19, # 13 Certificate of Sevice)(Rogowski, Patricia) (Entered: Jan. 20, 2011).

Joint Stipulation to Extend Time of Post-Trial Reply Briefs to Tuesday, Feb. 1, 2011—filed by Commissariat a LEnergie Atomique, SOITEC Silicon on Insulator Technologies SA, SOITEC U.S.A., Inc.. (Kraft, Denise) (Entered: Jan. 28, 2011).

Joint Stipulation to Extend Time of Post-Trial Reply Briefs to Friday, Feb. 4, 2011—filed by Commissariat a LEnergie Atomique, SOITEC Silicon on Insulator Technologies SA, SOITEC U.S.A., Inc.. (Kraft, Denise) (Entered: Jan. 31, 2011).

Redacted Version of 364 Opening Brief in Support,,,, *Redacted Version of Opening Brief in Support of Plaintiffs' Motion for Injunctive Relief and to Lift Stay on Damages Discovery* by Commissariat a LEnergie Atomique, SOITEC Silicon on Insulator Technologies SA, SOITEC U.S.A., Inc.. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Exhibit O, # 16 Exhibit P, # 17 Exhibit Q, # 18 Exhibit R, # 19 Exhibit S)(Kraft, Denise) (Entered: Feb. 2, 2011).

Reply Brief re 359 Motion for Judgment as a Matter of Law—*MEMC's Renewed Motion for Judgment as a Matter of Law or in the Alternative for a New Trial* filed by MEMC Electronic Materials Inc.. (Attachments: # 1 Certificate of Service)(Rogowski, Patricia) (Entered: Feb. 4, 2011).

Reply Brief re 361 Motion for Judgment as a Matter of Law *Plaintiffs' Renewed Motion for Judgment as a Matter of Law or in the Alternative for a New Trial* filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Feb. 4, 2011).

Declaration re 387 Reply Brief, *Declaration of Michael L. Brody in Support of Reply Brief in Support of Plaintiffs' Renewed Motion for Judgment as a Matter of Law or in the Alternative for a New Trial* by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Feb. 4, 2011).

Motion to Strike 386 Reply Brief, *Motion by Plaintiffs' to Strike Reply Brief in Support of MEMC's Renewed Motion for Judgment as a Matter of Law or, in the Alternative, a New Trial* (D.I. 386)—filed by Commissaiat a LEnergie Atomique, SOITEC Silicon on Insulator Technologies SA, SOITEC U.S.A., Inc.. (Attachments: # 1 Certificate of Service)(Kraft, Denise) (Entered: Feb. 8, 2011).

Opening Brief in Support re 390 Motion to Strike 386 Reply Brief, *Motion by Plaintiffs' to Strike Reply Brief in Support of MEMC's Renewed Motion for Judgment as a Matter of Law or, in the Alternative, a New Trial* (D.I. 386) Motion to Strike 386 Reply Brief, *Motion by Plaintiffs' to Strike Reply Brief in Support of MEMC's Renewed Motion for Judgment as a Matter of Law or, in the Alternative, a New Trial* (D.I. 386) filed by Commissariat a LEnergie Atomique, SOITEC Silicon on Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011).

Declaration re 391 Opening Brief in Support,, *Declaration of Marcus T. Hall in Support of Plaintiffs' Opening Brief in Support of Motion to Strike Reply Brief in Support of MEMC's Renewed Motion for Judgment as a Matter of Law or, in the Alternative, a New Trial* (D.I. 386) by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Feb. 8, 2011).

Redacted Version of 389 Reply Brief, *Redacted Version of Reply Brief in Support of Plaintiffs' Motion for Injunctive Relief and to Lift Stay on Damages Discovery* by Commissariat a LEnergie Atomique, SOITEC Silicon on Insulator Technologies SA, SOITEC U.S.A., Inc.. (Kraft, Denise) (Entered: Feb. 9, 2011).

Answering Brief in Opposition re 390 Motion to Strike 386 Reply Brief, *Motion by Plaintiffs' to Strike Reply Brief in Support of MEMC's Renewed Motion for Judgment as a Matter of Law or, in the Alternative, a New Trial* (D.I. 386) Motion to Strike 386 Reply Brief, *Motion by Plaintiffs'to Strike Reply Brief in Support of MEMC's Renewed Motion for Judgment as a Matter of Law or, in the Alternative, a New Trial* (D.I. 386) filed by MEMC Electronic Materials Inc..Reply Brief due date per Local Rules is Feb. 28, 2011. (Attachments: # 1 Exhibit 1-3, # 2 Certificate of Service)(Rogowski, Patricia) (Entered: Feb. 18, 2011).

Reply Brief re 390 Motion to Strike 386 Reply Brief, *Motion by Plaintiffs' to Strike Reply Brief in Support of MEMC's Renewed Motion for Judgment as a Matter of Law or, in the Alternative, a New Trial* (D.I. 386) Motion to Strike 386 Reply Brief, *Motion by Plaintiffs' to Strike Reply Brief in Support of MEMC's Renewed Motion for Judgment as a Matter of Law or, in the Alternative, a New Trial* (D.I. 386) filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 28, 2011).

PROCESS FOR THE TRANSFER OF A THIN FILM COMPRISING AN INCLUSION CREATION STEP

CROSS REFERENCE TO RELATED APPLICATION

This application is a divisional of U.S. application Ser. No. 11/747,733, filed May 11, 2007, now U.S. Pat. No. 7,883,994, which is a continuation of U.S. application Ser. No. 10/667,707, filed Sep. 22, 2003, now U.S. Pat. No. 7,229,899, which is a continuation of U.S. application Ser. No. 09/380,322, filed Aug. 30, 1999, now U.S. Pat. No. 6,756,286, which is a section 371 application of PCT/FR98/02904, filed Dec. 29, 1998, all of which are incorporated by reference herein.

TECHNICAL DOMAIN

This invention relates to a process for transferring a thin film of solid material. In particular, this process can be used to transfer a thin film of solid material onto a support composed of a solid material of the same nature or a different nature.

STATE OF PRIOR ART

Document FR-A-2 681 472 (corresponding to U.S. Pat. No. 5,374,564) describes a process for making thin films of semiconducting material. This document discloses that the implantation of a rare gas or hydrogen into a substrate made of a semiconducting material can cause the formation of a layer of micro-cavities or micro-bubbles (also denoted "platelets") at a depth close to the average projected range (Rp) of the implanted ions. The concept of micro-cavities obviously includes micro-cracks. The thickness of the layer of micro-cavities is determined by the implantation conditions. If this substrate is put into intimate contact with a stiffener through its implanted face and a heat treatment is applied at a sufficiently high temperature, an interaction occurs between the micro-cavities or the micro-bubbles separating the semiconducting substrate into two parts, firstly a thin semiconducting film bonding to the stiffener, and secondly the remainder that bonds to the semiconducting substrate. Separation takes place at the location of the micro-cavities or micro-bubbles. The heat treatment is such that the interaction between the micro-bubbles or micro-cavities created by the implantation induces a separation between the thin film and the remainder of the substrate. Therefore a thin film is transferred from an initial substrate to a stiffener used as a support for this thin film.

This process can also be applied to the manufacture of a thin film of a crystalline or non-crystalline solid material other than a semiconducting material (a conducting or dielectric material).

If the thin film delimited in the substrate is sufficiently stiff in itself (due to its thickness or due to its mechanical properties) a self-supported film may be obtained after the transfer annealing. This is described in document FR-A-2 738 671.

Document EP-A-0 767 486 proposes an improvement to the process disclosed in document FR-A-2 681 472 mentioned above. According to document EP-A-0 767 486 (see column 8), the process disclosed by document FR-A-2 681 472 has the following disadvantages. The choice of the thickness of the film to be transferred is a weak degree of freedom. The thickness of the film to be transferred (corresponding to Rp) and the conditions for separation of the film from the initial substrate are inter-related. The planeness of the film surface obtained after separation is unsatisfactory, and there is no way of maintaining a uniform thickness of a thin film during the transfer. The improvement proposed by document EP-A-0 767 486 consists of performing the ion implantation at depth Rp in a porous layer of silicon formed on the surface of a silicon substrate. This ion implantation causes an increase in the porosity (pore density) to the extent that microcavities appear in the walls of the pores of the porous layer. This layer is then considered as being a fine porous structure. Under some implantation conditions, separation is caused in this fine porous layer in accordance with the mechanism described in document FR-A-2 681 472. Therefore, there are two zone effects, firstly due to a zone of pores created by a porous silicon generation step, and secondly due to a zone of cavities generated between the pores in the small perfect silicon zones as in the process according to document FR-A-2 681 472. Therefore, the proposed improvement consists of using a porous layer to obtain a layer with a well-controlled uniform thickness after separation.

The process disclosed by document EP-A-0 767 486 recommends the formation of porous silicon (the order of the porosity is a percentage equal to several tens), which is equivalent to removing silicon or material from the separation zone which causes weakening of the material.

A more significant improvement to the process revealed by document FR-A-2 681 472 would be to reduce thickness of the micro-cavities layer obtained by ion implantation. This is what is proposed in this invention.

DESCRIPTION OF THE INVENTION

The improvement proposed by this invention is made possible due to creation of an inclusion or a set of inclusions in the initial substrate material, in order to confine gaseous compounds introduced during the ion implantation step. An inclusion is a volume of material for which the properties are not the same as the properties of the substrate material from which one or more thin films are to be transferred. Inclusions may be in the form of a layer that extends approximately parallel to the surface through which the implantation is done. These volumes may have a variety of shapes and their dimensions may vary from a few tens of nanometers to several hundreds of micrometers.

The role of these inclusions is to act as traps for implanted gaseous compounds. The radius of action of these traps depends on the nature of the inclusions made. In this case, there is no removed material, as is the case for the process disclosed by document EP-A-0 767 486.

The process according to this invention comprises a preliminary step that consists of forming inclusions in the initial substrate material. A subsequent step consists of implanting gaseous compounds (rare gas or other) in this material. The presence of inclusions formed during the previous step causes confinement of implanted gaseous compounds. The efficiency of these inclusions is related to their power to confine gaseous compounds.

Inclusions may be formed close to a perfectly controllable depth. Their presence then introduces confinement of implanted compounds within a disturbed layer which is much thinner than can be obtained using the process according to known art. This produces several advantages. The implanted gaseous compounds are preferably trapped at the level and/or within the zone influenced by these inclusions, called the neighborhood of these inclusions. This precise position means that a separation (transfer) fracture can be induced at and/or near the inclusions. The result is a relatively low surface roughness at the fracture. Furthermore, due to the confinement power, this process enables the use of low implanted doses necessary for the fracture. Finally, the confinement effect due to the presence of inclusions can reduce the thermal budget necessary for the fracture, to the extent that nucleation and growth of cavities leading to fracture is encouraged. The advantage is obvious for transferring film structures in which there is a limit on the maximum temperature rise. For example, one case is the heterogeneous gluing of materials with coefficients of expansion that differ by more than 10%.

Therefore, the purpose of the invention is a process for the transfer of at least one thin film of solid material delimited in an initial substrate, characterized in that it comprises the following steps:
- a step in which a layer of inclusions is formed in the initial substrate at a depth corresponding to the required thickness of the thin film, these inclusions being designed to form traps for gaseous compounds which will subsequently be implanted;
- a subsequent step for implantation of the said gaseous compounds, in a manner to convey the gaseous species into the layer of inclusions, the dose of implanted gaseous compounds being sufficient to cause the formation of micro-cavities likely to form a fracture plane along which the thin film can be separated from the remainder of the substrate.

The step of implanting gaseous species can be carried out with an implantation energy of these gaseous species that is such that their mean depth of penetration into the substrate corresponds to the depth of the layer of inclusions. It can also be carried out with an implantation energy of these gaseous species that is such that their mean depth of penetration into the substrate is close to the layer of inclusions, this implantation being associated with a diffusion heat treatment to allow the migration of the implanted species to the layer of inclusions.

The implantation step may be performed from one or several gaseous compounds implanted either simultaneously or in sequence.

The initial substrate may be composed of a solid part supporting a structure composed of one or more films, in which the said film of solid material must be delimited. All or part of this structure may be obtained by epitaxy. This structure may be such that the remainder of the substrate, which may or may not be an epitaxy carrier, can be reused after the thin film has been transferred to transfer another thin film.

The layer of inclusions may be formed by a film deposition technique. It may then consist of generating columns or generating grains.

Inclusions may have a chemical affinity with the said gaseous compounds.

Inclusions may originate from a parametric mismatch between the material forming the inclusions layer and substrate regions adjacent to it. This parametric mismatch may consist of a change in the size of crystalline parameters, changes in the crystalline orientation along a plane parallel to the surface of the transferred structure, a difference in the coefficient of thermal expansion between one of the films and the initial material (and/or other films).

The inclusions layer may also be formed by a technique for etching a substrate layer.

It may also be formed by the implantation of elements in a substrate layer. These elements may be implanted in one or several steps. Implantation of these elements may be assisted by heat treatment capable of increasing the efficiency of traps, this heat treatment possibly being done before, during and/or after implantation. This heat treatment may modify the morphology and/or composition of the inclusions, which encourages subsequent confinement of gaseous compounds. This heat treatment is done at a temperature and for a period such that it cannot be used to make a fracture over the entire inclusions layer.

The inclusions layer may also be obtained by heat treatment of the film(s) and/or by applying stresses to the film(s) in the film structure.

The inclusions layer may also be obtained by a combination of the different techniques mentioned above.

The gaseous compounds may be implanted by bombardment of the compounds chosen among neutral compounds and ions. It may also be done by a method chosen from plasma assisted diffusion, thermal diffusion and plasma assisted diffusion combined with thermal diffusion and/or assisted by electric polarization. Implantation may take place normal to the implanted surface of the substrate, or at a certain incidence. It may be done using rare gases, or other elements.

The process may comprise a heat treatment step capable of weakening the substrate at the inclusions layer to enable separation between the thin film and the remainder of the substrate. This heat treatment is applied with a given thermal budget which depends on the various thermal budgets used during the process. In particular, this heat treatment takes account of the temperature rise(s) induced by heat treatments in which thermodynamic equilibrium is not achieved, such as temperature rises resulting from the inclusions formation step and/or the step of implanting gaseous compounds and heat treatments involving heating or cooling of the substrate, for example such as for implantation, or reinforcement of the bond forces when gluing on a support. Therefore this heat treatment may be zero if the said weakening can be achieved by other steps in the process. It may be achieved by applying a positive temperature or a negative temperature. This weakening according to the invention is such that it enables separation of the thin film from the remainder of the substrate with or without the use of mechanical stresses. This heat treatment may be obtained by pulsed heating, for example in order to quickly increase the temperature. For example, this pulsed heating may be of the RTA (Rapid Thermal Annealing) or RTP (Rapid Thermal Process) type.

The process may also comprise a step in which the thin film delimited in the substrate is put into intimate contact with a support onto which the thin film will bond after it has separated from the remainder of the substrate. The film may be put into intimate contact directly (for example by wafer bonding) or through an added on material. A heat treatment step may be used to reinforce the bond between the thin film delimited in the substrate and the added on support.

Mechanical stresses may be exerted during and/or after and/or before the heat treatment, to contribute to separation between the thin film and the remainder of the substrate.

The process according to the invention is particularly suitable for the transfer of a thin silicon film from an initial substrate. It may also be applied for the transfer of a thin film made of a III-V semiconducting material (for example AsGa), from an initial substrate. The thin film may itself be composed of a thin film structure. It may have been at least partially treated before its transfer, to form, over all or part of the film to be transferred, an integrated circuit or to form, over all or part of the film to be transferred, an optoelectronic component on it.

BRIEF DESCRIPTION OF THE DRAWINGS

The invention will be better understood after reading the following description, given as a non-restrictive example, accompanied by the attached drawings in which.

DETAILED DESCRIPTION OF EMBODIMENTS OF THE INVENTION

Figure 1:
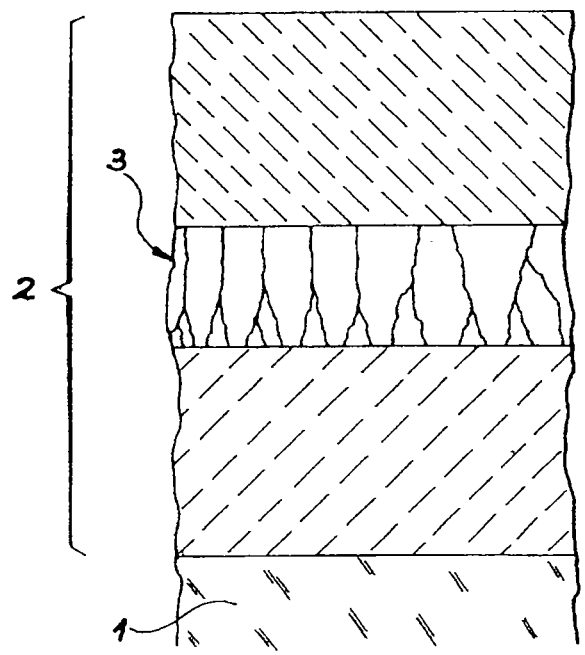
FIG. 1 is a cross-sectional view of a substrate formed on an initial support on which a sputtering technique is used to grow a film structure comprising a layer of inclusions due to columnary growth.

The substrate from which the thin film will be transferred may be a solid substrate (formed from a single material) or a composite substrate, in other words formed from films with identical or different chemical and/or physical natures.

Inclusions may be generated in the initial material, particularly by:
- a structural change in the initial material (crystalline structure, crystalline orientation, locally amorphous fields, missing material, etc.);
- a change in the physical nature (densification, inclusion of gas during production, implantation of various ions, ionic etching and/or selective chemical and/or electrochemical etching on several layers, etc.);
- a change in the chemical nature or chemical bonds (doping effect, composition variation effect, use of an interface of a previously glued structure, nucleation and/or growth of precipitates, etc.);
- more or less local material deformations (interface effects, effect of heat treatments on layers with different coefficients of expansion, effect of stresses generated between consecutive layers, etc.).

A number of techniques for preparation or treatment of materials in films can be used to make inclusions in a zone relatively parallel to the material surface.

For example, in terms of applications the advantage of this type of process is that it enables a substrate change for one or several stacked films, for a structure that is partially or completely treated in order to make a micro-electronic component, a sensor, etc. For example, this need may be very important in the case in which the transferred film or structure is to be subjected to heat treatments that the final support is unable to resist (excessive temperature, excessive difference in thermal expansion, etc.).

The various techniques for deposition of films can be used to make stacks of one or several films, in which the film composition, their stress, structure and morphology, can easily be varied. A film deposition means adding and/or making a film. These various possibilities can be used to generate inclusions in the initial material before the step in which gaseous compounds are implanted. Interfaces, film(s) and their neighborhood(s) concerned are subsequently considered as being a zone of inclusions, which act as traps for gaseous compounds implanted during the second step of the process.

There are many deposition techniques chosen as a function of the nature of the materials to be prepared. Materials may be amorphous, polycrystalline or mono-crystalline. For some applications, deposits must be made by epitaxy (homogenous or heterogeneous). The most frequently used deposition techniques include depositions by ion sputtering, depositions by reaction in vapor phase at high or low pressure, assisted or not assisted by plasma, depositions by molecular jet, depositions by epitaxy in the liquid phase, depositions assisted by laser ablation.

The ion sputtering technique enables columnary growth with different orientations and sizes. These sizes and orientations can be controlled depending on the deposit pressure, temperature and energy conditions. In columnary growth, the growth of some of the columns is stopped to the benefit of other columns which get larger. For example, in the production of Co (Zr, Nb) films, an argon pressure of the order of 30 mTorrs during the deposition encourages columnary growth. This effect may be used to impose specific magnetic properties on the deposit with respect to the initial support plane. Zones at and/or near the end of the columns that have been stopped in their growth are exclusion zones.

FIG. 1 illustrates a substrate thus obtained. It is formed from an initial support 1, which may or may not be composite, on which a thin film structure 2 is grown by sputtering. A columnary growth was provoked inside structure 2 to build up a layer 3 of inclusions that will be used as a trap zone for the gaseous compounds to be implanted. The location of the fracture surface within or around the trap zone depends on the efficiency of the traps created.

This deposition technique can also produce growth in medium sized grains (mono-crystalline, polycrystalline or amorphous agglomerates) with very easily controllable dimensions. For example, if Tm is the melting temperature of the material to be deposited, a deposition temperature T such that the ratio T/Tm exceeds 0.5, encourages growth in crystalline grains. Further information about this subject is given in the article by A. G. DIRKS and N. J. LEAMY published in the Thin Solid Films journal, 47, 219 (1977). Joints between grains are also inclusion zones for the process according to this invention.

Figure 2:
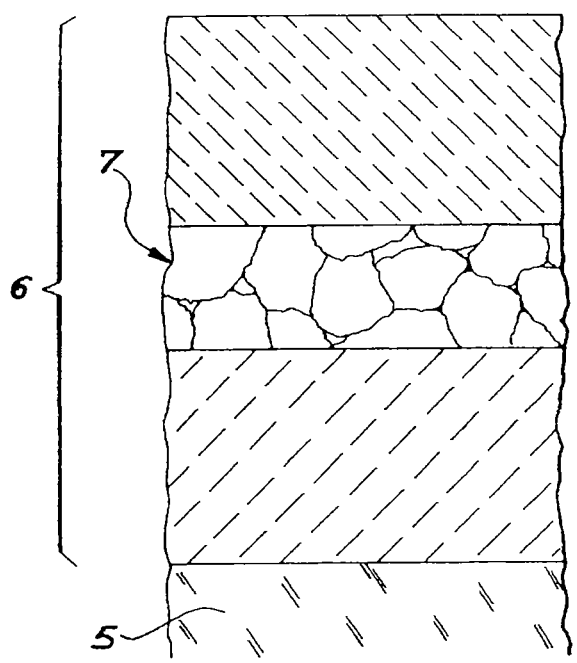
FIG. 2 is a cross-sectional view of a substrate formed on an initial support on which a sputtering technique is used to grow a film structure comprising a layer of inclusions due to granular growth.

FIG. 2 illustrates a substrate thus obtained. It is formed of a composite or non-composite initial support 5 on which a thin film structure 6 is grown by sputtering. Granular growth was provoked inside structure 6 to build up an inclusions layer 7 that will be used as a zone of traps for gaseous compounds to be implanted. The position of the fracture surface at the inclusions zone depends on the efficiency of the traps created.

In general, film deposition techniques can be used to obtain films with perfectly controllable thicknesses. It is then possible to make thin structures composed of single or multiple films. Film deposits are made without any crystalline relation (with the initial support and/or between films) or in epitaxy (homogeneous or heterogeneous). Furthermore, the term film deposits must include deposits of multi-layer films comprising buffer layers and/or seed layers, in order to form crystalline structures. Note that in the case of homogeneous epitaxy of a film on a support of the same nature, the interface (if it exists) may be the location of inclusions. Gaseous compounds subsequently implanted will be located at and/or near this interface.

These structures formed of one or more films occupy all or part of inclusion zones, given:
- the physical and/or chemical nature of the films (chemical interaction between films, variation in crystalline orientations in the case of multi-layer structures, affinity for gaseous compounds that will be implanted later, etc.);

the stresses present in these various films and interfaces generated (due to a mismatch of crystalline meshes, the difference in coefficients of thermal expansion, the interface micro-roughness, inclusions of elements other than elements of the material to be deposited, inclusions of heterogeneous phases, etc.).

For example, a multi-layer structure can be made in which at least one crystalline film is deposited, separated from the initial crystalline support by one or several films, called buffer and/or seed layers. The crystalline orientations in the crystalline film may be identical or different to the orientations of the initial support. The role of the buffer layers is to provoke variations in crystalline orientation over all or part of the surface of the platelet, particularly in the plane with respect to the initial support. In this case, a stress and/or dislocations zone is generated, which will be used to adapt crystalline meshes. This zone is located close to the films mentioned. For the deposition of superconducting YBaCuO films, it is thus made epitaxially on $SrTiO_3$ and/or $CeO_2$ buffer layers. These buffer layers are in epitaxy on a sapphire substrate in the R plane (1102). Mesh matching imposes a rotation of 45° of the type <001> crystalline axes in the plane, at the same time as a high stress close to interfaces or within the volume of the films mentioned. This 45° rotation may be eliminated in some zones by interposition of a very thin MgO film within these zones. Further information about this subject is described, in the article "Bi-Epitaxial YBCO Grain Boundary Josephson Junctions on $SrTiO_3$, and Sapphire Substrates" by S. NICOLETTI et al, published in the Physica Journal C 269 (1996) 255-267.

Figure 3:
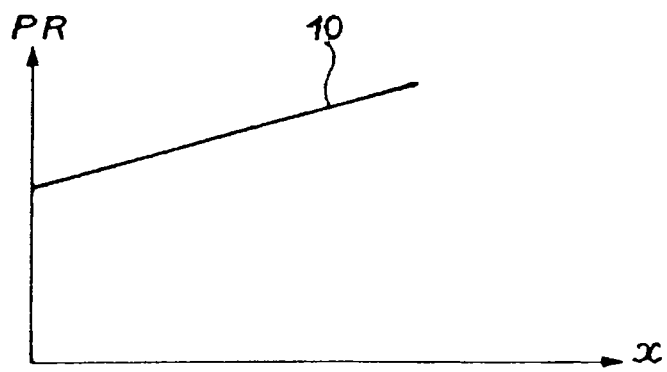
FIGS. 3 and 4 are diagrams showing the variation in the grid parameter of a crystalline composition as a function of the content of an element introduced in the composition.
Figure 4:
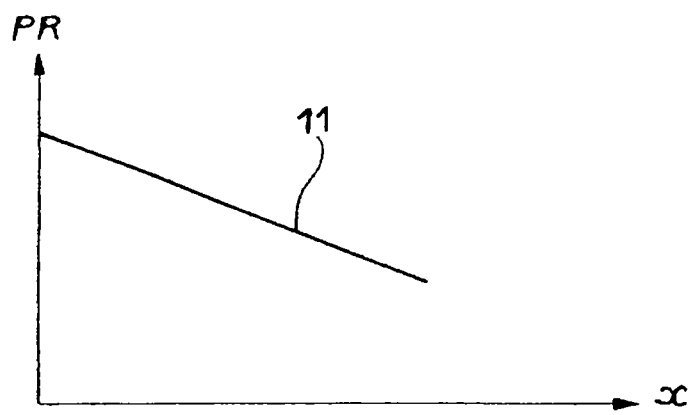

Another example related to stresses caused by mismatches between crystalline meshes would be chemical vapor phase depositions (CVD) of $Si_{(1-x)}Ge_x$ films on a silicon support. The stress will be controlled as a function of the concentration x of germanium in the film composition. FIG. 3 shows how the grid parameter PR varies as a function of the germanium concentration x in the composition. The slope of straight line 10 is equal to +0.022 nm depending on the atomic percentage of Ge. Another example is the effect of stresses related to the degree of doping in a silicon film (for example doping by boron at $10^{14}$ to $10^{20}$ atoms/cm$^3$) deposited on a slightly doped silicon board. FIG. 4 shows how the network parameter PR varies as a function of the concentration x of boron atoms as an atomic percentage. The slope of the straight line 1 is equal to −0.14 nm. We could also include the concept of inclusions by chemical nature. Thus a Ti film deposited on a silicon support and then covered with an encapsulating film maintains a strong sensitivity to any oxygen that may be present (the "getter" effect) and diffuses through the silicon at the time of a later heat treatment. The induced effect is to generate a stressed zone called the inclusions zone.

An example of the generation of stresses during film depositions is the use of deposition parameters such as the deposition pressure, the deposition temperature, the deposition power, the composition of the deposition atmosphere through the ratio of the partial pressures of carrier gases, neutral gases and reactive gases. It is known that stresses may create a state of high compression or high tension in the deposited films, depending on the film deposition pressure. The article by A. MATERNE et al. entitled "Changes in stress and Coercivity after Annealing of Amorphous Co (Zr, Nb) Thin Films Deposited by R.F. Sputtering", E.M.M.A. conf., Salford, United Kingdom, Sep. 14-16, 1987, contains further information about this subject. Thus, in the case of a deposition by cathodic sputtering of Co (Zr, Nb) films, a low pressure of the order of a few mTorrs will lead to a state of compression of the film, whereas a high pressure of the order of several tens of mTorrs will cause the same material to be in a state of tension. It has been determined by a chemical analysis that this variation is caused by the argon and oxygen density included in the film at the time of the deposit. The magnitude of the stresses is such that they can cause bond defects of films in limiting cases.

The term "film deposit" includes any heat and/or physico-chemical treatment carried out before or after the deposition, in order to induce these effects in the deposited films.

Inclusions may also be generated by etching. Etching by a dry method (ionic, reactive ionic) and/or a "wet" chemical method (selective etching, anisotropic etching) and/or an electrochemical method can be used to make selected sizes of cavities open over a very small surface area. These cavities may or may not be filled in later with a trap material for the gaseous compounds necessary for the transfer.

Techniques for etching multi-layer structures may be used to generate inclusions, more or less assisted by partial masking techniques over all or some of the surface of the platelet (conventional techniques in microelectronics). Thus, it is possible to etch a grid of very small (submicronic) openings in a very thin surface film of silicon nitride. An insolation technique is used through a mask on a positive or negative resin film. In some zones, the resin film may then be withdrawn chemically by a developer adapted to the resin used. In these open zones, an etching technique using an accelerated ion beam, called ionic etching, can be used to make openings in the silicon nitride film. When this surface film is deposited on the surface of a silicon film, it then becomes possible to etch the silicon in line with the openings made, using tetramethylammonium hydroxide. This chemical etching is very selective to the extent that the silicon etching speed is more than 100 times greater than the nitride etching speed. It is then possible to make cavities larger than the openings generated in the nitride film.

Figure 5:
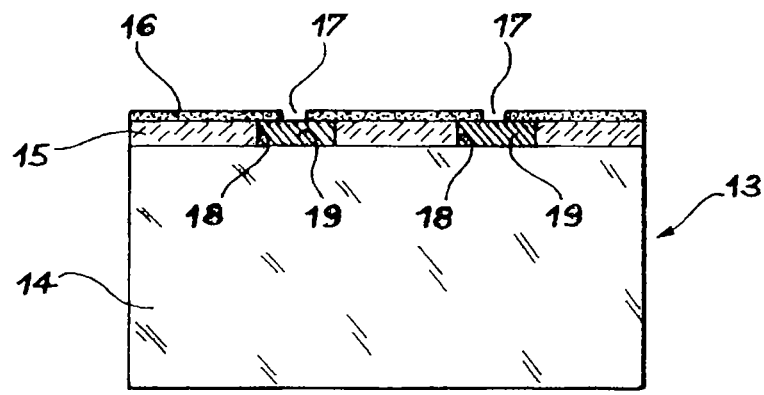
FIG. 5 is a cross-sectional view of a substrate on which inclusions are generated by etching.

FIG. 5 shows this type of embodiment. It illustrates a substrate 13 composed of an initial support 14 covered by a silicon film 15. The film 15 is coated with a very thin film of silicon nitride 16 in which small openings 17 are formed. Openings 17 were used to obtain cavities 18 in the silicon film 15. Depending on the dimension of the openings 17 made in the silicon nitride film 16 and the thickness of this film 16, it is possible to deposit a material 19 in cavities 18, the chemical nature of this material being favorable to trapping (for example titanium for its getter effect) gaseous compounds (for example oxygen) implanted during the later implantation step.

Subsequently, openings made by the deposit of a layer may be obstructed. This deposit is not always necessary, like for example in the case of a transfer of a structure of pads made in a crystalline silicon film. Similarly under some conditions, heat treatments under controlled atmosphere are used to facilitate closing some cavities, or even to close the cavities. In the process according to the invention, these etching zones will be considered as being inclusions, and traps for gaseous compounds implanted later.

Inclusions may also be generated by ion implantation.

Implantation by bombardment of neutral compounds or ions in a material can generate a layer rich in inclusions at a specific depth of the implanted element. For implanted compounds, electronic and nuclear retarding effects of the target material are then considered. In the process according to the invention, the initial material is considered to be the target material. The implantation process may be done in one or several implantations. These implantations may possibly be assisted during or between each implantation by heat treatment. The implanted compounds and associated defects will be found close to an average projected range Rp. Inclusions generated appear as a disorder at a small scale in the local order of the material. Their morphology and size may be modified by heat treatment and/or single and/or multiple implantation of the same or a different element.

For example, consider the production of a silicon on insulator (SOI) material using the SIMOX (Separation by Implantation of OXygen.) process. Implantation of oxygen at 120 keV is followed by heat treatment at high temperature (for example about 1300° C.) to modify the topology and morphology of the generated inclusions. The implantation of oxygen at a low dose (about $4.10^{17}$ $O^+/cm^2$) within a silicon board, can produce a thin oxide layer typically at a depth of 250 nm (typical thickness 80 to 100 nm). This layer is defective; it is more or less continuous (presence of silicon pipes) and it contains silicon islands (typical dimensions a few tens of nanometers), depending on the implanted dose. In this respect, refer to the article by B. ASPAR et al. entitled "Ultra Thin Buried Oxide Layers Formed by Low Dose SIMOX Processes", Proc. 6th International Conference on SOI Technology and Devices, Electroch. Soc., Vol 94-11 (1994) 62. Similarly, the interfaces of this oxide layer with the upper film are more or less rough depending on the imposed heat treatments. Typically, the interface roughness may be controlled within a range of a few tens of nanometers to a few nanometers, as described in the article entitled "Characterization by Atomic Force Microscopy of the SOI Layer Topography in Low-Dose SIMOX Materials" by C. GUILHALMENC et al., published in the Materials Science and Engineering journal B 46 (1997) 29-32. This implanted layer and its interfaces will be considered as being an inclusion zone, confinement zones for gaseous compounds implanted during the second step of the process according to the invention.

Heat treatments may also be used to generate inclusions in the initial material, support or in at least one of the layers of the film structure to be transferred.

For example for silicon, "high-low-high" heat treatments are used to precipitate oxygen present in the material at a specific depth. This depth is typically a few micrometers in the case of monocrystalline silicon obtained by Czochralski pulling. This is done by applying a temperature cycle typically consisting of a constant high temperature above 1000° C., followed by a constant low temperature below 900° C., and then another constant high temperature above 1000° C. An order of magnitude of the depth x can be evaluated starting from the diffusion equation $x \propto (Dt)^{1/2}$ where D is the coefficient of diffusion at the heat treatment temperature and t is the diffusion time at this temperature. This layer generated by heat treatments is considered as being an inclusion zone. As another example, heat treatments are known to enable adaptation of the stress level in films deposited by any one of the methods mentioned above. Thus, a heat treatment above 500° C. for a silicon oxide film deposited by CVD, can reduce the compression stress, or cancel it entirely, or even transform it into a tension. [See A. SLINTANI et al., J. Appl. Phys. 51 (8), p 4197 (1980)]. This type of behavior is considered to be caused by the reactions of the oxide to water vapor. It may be interpreted as being a degassing effect or a densification effect. Similarly, a large thermal expansion between one of the films and the initial support (or the other films) can cause a high stress state and locally generate stress inclusions, which encourage trapping of gaseous compounds. For example, there is the case of the silicon film (100) prepared on a sapphire, R plane. Coefficients of expansion are of the order of $4.10^{-6}/K$ and $9.10^{-6}/K$ respectively. Since the stress is very localized within the thickness of films around the interface, this results in local deformation of the material. A zone disturbed in this way is considered as being an inclusions zone in the process according to the invention.

Another way of inducing a stress on a plane film structure is to deposit a very highly stressed film on the back surface of the initial support, enabling a morphological deformation (concavity or convexity). The film structure is then deformed. The locally stressed zone in the structure containing the film or films to be transferred in the process according to the invention, is an inclusions zone for gaseous compounds implanted later on.

The process according to the invention comprises a second step after the generation of inclusions in the material concerned. This second step consists of implantation of gaseous compounds (atoms, ions) at a depth close to the layer of inclusions generated in the previous step. These gaseous compounds are confined, by means of the presence of inclusions. They participate in nucleation and/or growth of the micro-cavities, micro-bubbles (or "platelets") necessary for the transfer fracture. This implantation may be achieved through the plane surface of the structure to be transferred by bombardment and/or by plasma assisted diffusion and/or by heat treatment and/or by electrical polarization.

In the case of implantation by bombardment (neutral compounds and/or ions), these gaseous compounds are implanted at the average projected range, Rp. This depth is characteristic of the implantation energy of the element implanted in a given target. Therefore, an implantation energy will be chosen such that the depth Rp corresponds to the level of the inclusions zone or is such that the depth is close to the zone of inclusions, a diffusion heat treatment then being used to allow the species implanted at the level of the inclusion zone to migrate. Gaseous compounds may or may not be rare gases such as H, F, He. They may be implanted at the same time or in sequence.

Figure 6A:
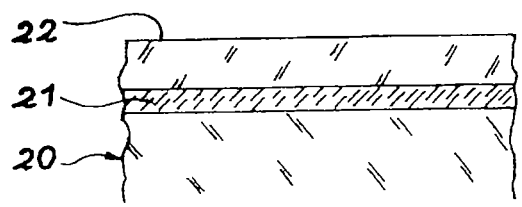
FIGS. 6A to 6D illustrate the process according to the invention in the case in which a thin film is transferred onto a stiffener.
Figure 6B:
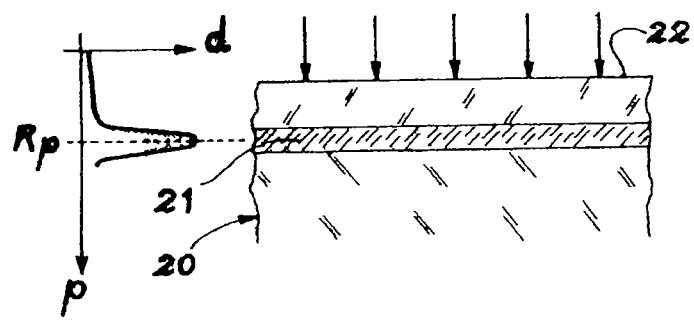
Figure 6C:
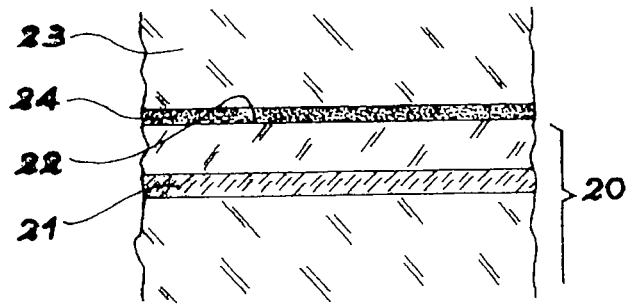
Figure 6D:
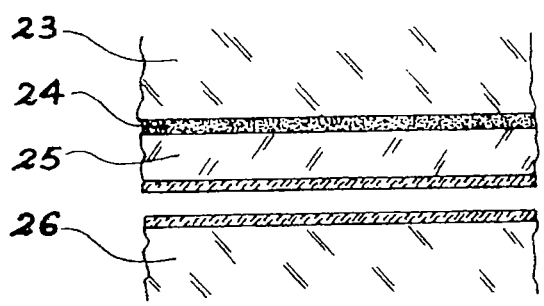

FIGS. 6A to 6D illustrate the process according to the invention in the case in which the thin film is transferred onto a stiffener. FIG. 6A shows a substrate 20 (for example formed of a structure of thin film(s) on an initial support), comprising an inclusions zone 21 formed by one of the methods described above. The inclusions zone is located at a distance from the surface 22 of the substrate corresponding to the thickness of the thin film to be transferred. FIG. 6B illustrates the ion implantation step. Gaseous compounds are implanted, for example by bombardment or diffusion, through the surface 22 of the substrate. The density d of gaseous compounds as a function of the depth p is such that their average projected range Rp corresponds to the inclusions zone 21 which becomes a trap zone with a high density of gaseous compounds. FIG. 6C illustrates a step in which the surface 22 of substrate 20 is bonded onto a stiffener 23 with the addition of an intermediate layer 24. Other techniques may also be used for bonding the surface 22 and the stiffener 23, without the addition of an intermediate layer. FIG. 6D illustrates the separation step subsequent to an appropriate heat treatment as a function of the required thermal budget as described above. In this figure, the separation fracture enters into the trap zone. Therefore, the initial substrate consists of a thin film 25 bonding to the stiffener 23 and a remaining part 26. The traps zone is shown in the diagram as consisting of two separate regions. However depending on the case, it may remain complete either by bonding to the thin film 25, or to the remaining part 26 of the substrate.

In the case of implantation by gaseous diffusion, the compounds may diffuse to a depth close to the depth of the inclusions, by adapting the diffusion time and temperature. Classical diffusion laws in $(Dt)^{1/2}$ are applicable to adapt the diffusion depth. Thus, a heat treatment under an argon and hydrogen atmosphere at a ratio of 9:1 (called the forming gas) enables hydrogen diffusion in silicon at about 350° C.

Regardless of the implantation method, the quantity of implanted gaseous compounds must be sufficient to participate in nucleation and/or development of micro-cavities, micro-bubbles (or platelets) starting from and near by the inclusions described above. Implantation conditions (dose, energy, target temperature, implantation time) depend particularly on:

the initial material (target),
the nature and location of inclusions,
the thermal budget supplied by the implantation,
the nature of the implanted gaseous compounds,
the thermal budget supplied subsequent to gluing (if any),
the thermal (energy) budget supplied by the weakening heat treatment,
any mechanical stresses.

However, implanted doses must be less than the maximum dose determined by the occurrence of exfoliation in the material during implantation. The efficiency of inclusions is defined by their confinement power on the gaseous compounds necessary for the transfer, considering the concentration of these compounds close to the inclusions.

In the case of ion implantation, this effect is illustrated by a reduction in the width of the implantation profile due to a higher concentration of implanted compounds around the implantation Rp. For example, consider a structure to be transferred composed of a 0.4 .mu.m thick $SiO_2$ film generated on a silicon support. A first ion implantation of hydrogen equal to $3.10^{16}$ H$^+$/cm$^2$ with an energy of 100 keV designed to generate inclusions, will result in a concentration of hydrogen at the average depth of 0.9 .mu.m. A heat treatment is carried out typically at about 350.degree. C. for 2 hours, and is designed to modify the morphology of the inclusions (micro-cavities). It is found that the layer containing the cavities is thinner than if the implantation had been done with a higher dose as in the case of the process disclosed by document FR-A-2 681 472. The inclusions zone corresponds to this layer of growing micro-cavities. A second implantation of $2.10^{16}$ H$^+$/cm$^2$ will be sufficient to enable a fracture close to this inclusions zone during separation heat treatments, for example at 500.degree. C. for 1 hour.

It is very easy to understand the advantage of confinement and possible location of micro-cavities, micro-bubbles (or platelets) over a very small thickness due to the thickness of the inclusions zone made and/or the film structure used. Similarly, the roughness of the fracture surface will also be reduced due to confinement of the inclusions and therefore the fracture zone.

In general, it is then possible to reduce the dose to be implanted necessary for nucleation and/or development of micro-cavities and/or reduce the forces to be exerted and/or reduce the energy budget of the heat treatment to induce fracture.

The transfer process designed to obtain a final film structure on a support assumes that the initial material is added onto a second support during a third step. The contact is made directly by wafer bonding, or through a bond layer. It must enable the final support to act as a stiffener. In both types of contact (direct and indirect), a fixation step may be necessary using a low temperature heat treatment. This treatment must be adapted so that it does not prevent micro-cavity and fracture growth mechanisms in the initial material. It will have to be taken into account in the thermal budget necessary to induce the fracture during a fourth step in the process. If the structure to be transferred is sufficiently stiff and/or thick and this step is not necessary, a "self-supported" structure will be obtained during the transfer.

Thus, in the example of a structure covered with an $SiO_2$, film to be transferred to a silicon support, a temperature of the order of 200° C. will be sufficient to reinforce the wafer bond. The gluing energy between the oxide film and the silicon support will exceed 0.3 J/m$^2$.

The fourth step in the process for transferring film structures requires a heat treatment for which the time and temperature are defined, particularly as a function of the efficiency of the inclusions created, the dose of implanted gaseous compounds, thermal conditions for implantation of the initial material, and thermal conditions for bonding to the final support plate. The heat treatment must be sufficient to cause a fracture in the initial material. This thus provokes separation of an unused part of the initial material from the film structure in contact with the final support. This separation takes place close to the layer of trapped compounds. Under the conditions according to the invention, the film structure (single layer or multi-layer) may be transferred with a lower fracture thermal budget than thermal budgets necessary in the process according to prior art. In defining the separation thermal budget, it is necessary to take account of the efficiency of the generated inclusions and the global thermal budget that is input to plates during the various steps of the process, namely during generation of inclusions, implantation and bond of the initial material on the stiffening support.

Furthermore, part of the energy necessary for the transfer of structures may be input by heat treatment and/or by means of stresses, for example related to a final support stiffening effect, related to the application of shear, bending, tension or pressure stresses, applied alone or in combination. The effect is of the same nature as that described in document FR-A-2 748 851. In this case, the minimum dose of gaseous compounds to be implanted during the second step of the process is the dose above which there is sufficient creation and/or growth of micro-cavities to induce sufficient weakening of the platelet parallel to the surface.

Figure 7:
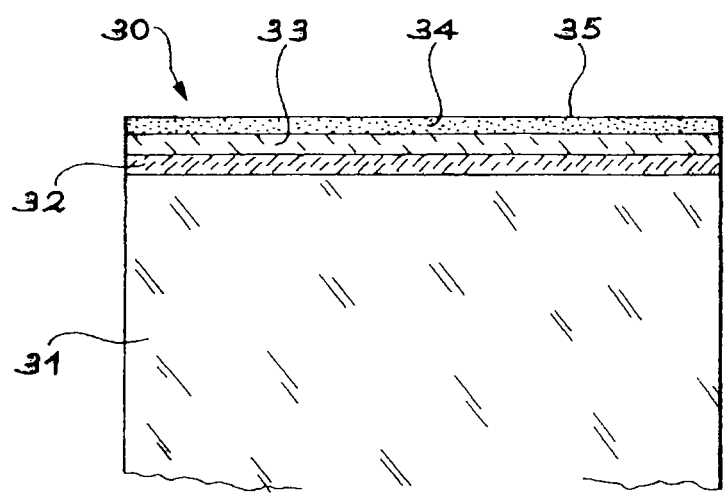
FIG. 7 is a cross-sectional view through a substrate that can be used to obtain an SOI structure using the process according to the invention.

FIG. 7 illustrates an application of the process according to the invention when an SOI structure is obtained. The initial substrate 30 is formed starting from a silicon platelet 31 on a face on which a silicon film 32 about 50 nm thick is deposited, strongly doped (about $10^{19}$ atoms/cm$^3$) by boron produced by epitaxy. The film 32 is itself covered with a silicon film 33 about 350 nm thick, slightly doped (about $5.10^{15}$ atoms/cm$^3$) by boron and also produced by epitaxy. Finally, the film 33 is coated with an $SiO_2$, film 34 about 400 nm thick and with a free surface 35. The highly doped silicon film 32 will act as the inclusions zone.

The substrate 30 is then submitted to the gaseous compound implantation step through surface 35. Hydrogen is implanted at a dose of $5.10^{16}$ atoms/cm$^2$, at an energy of 80 keV and at ambient temperature.

The surface 35 is then made to bond to a silicon plate by wafer bonding reinforced by heat treatment at 250° C. for 30 minutes.

The step in which the initial of substrate 30 is separated into two parts comprises a heat treatment, the efficiency of the heat treatment with respect to the fracture being adapted by the thermal budget (duration and temperature of the various heat inputs). This final heat treatment induces a fracture in the initial substrate, at and/or close to the film 32. The final heat treatment may typically be 2 hours at 250° C.

It is thus possible to obtain a structure formed of a slightly doped silicon film (film 33 in the initial substrate) on a silicon oxide layer (film 34 in the initial substrate), which is attached to a silicon mass. The highly doped silicon film 32 was used for confinement of the fracture.

The process according to the invention is particularly attractive for the transfer of structures in which one or several films must not be subjected to heat treatment at a temperature as high as the temperature involved in the process disclosed in document FR-A-2 681 472. The process is also useful in the case in which the structure to be transferred is composed of materials with different coefficients of thermal expansion.

Finally, it is important to note the following advantage of the process according to the invention. The surface of the transferred film structure is a disturbed zone obtained during the fracture. The thickness of this disturbed zone may be very small due to the use of a layer at and/or close to the inclusions to confine the dose of implanted gaseous compounds. This thus gives a low surface roughness of the transferred structure, since it is directly related to the distribution of micro-cavities or micro-bubbles within the thickness of the material during the transfer.

The invention claimed is:

1. A process for forming a thin film from a substrate comprising the steps of:
   (a) forming a material layer on the substrate;
   (b) etching cavities in the material layer to form a gaseous compound trap zone at a depth in the substrate corresponding to a required thickness of the thin film and extending parallel to a surface of the substrate;
   (c) after etching cavities, introducing into the material layer, a dose of gaseous compounds sufficient to cause formation of micro-cavities in a fracture plane including the gaseous compound trap zone and along which the thin film can be separated from the remainder of the substrate, the gaseous compound trap zone substantially confining the gaseous compounds therein; and
   (d) separating the thin film from the substrate along the fracture plane and thereafter recovering the thin film.

2. The process for forming a thin film according to claim 1 further comprising filling the cavities with a material before introducing the dose of gaseous compounds.

3. The process for forming a thin film according to claim 2 wherein filling the cavities with a material comprises filling with a material having a parametric crystalline mismatch with the adjacent regions of the substrate.

4. The process for forming a thin film according to claim 1, wherein etching cavities comprises forming a patterned thin film on the material layer and etching cavities using a dry or wet etching technique to form an inclusion layer using the patterned thin film as an etching mask.

5. The process for forming a thin film according to claim 4, wherein forming a patterned thin film comprises etching a grid of openings in a thin film deposited on the material layer.

6. The process for forming a thin film according to claim 1, wherein recovering the thin film comprises placing a support in intimate contact with the substrate such that the thin film bonds to the support thereby transferring the thin film from the substrate to the support.

7. A process for forming a thin film comprising:
   etching openings in a surface of a substrate to form a gaseous compound trap zone at a depth in the substrate corresponding to a required thickness of the thin film and extending parallel to a surface of the substrate;
   after etching the openings, introducing gaseous compounds in the substrate in an amount sufficient to form micro-cavities in a fracture plane therein including the gaseous compound trap zone,
   wherein the openings comprise inclusions in the fracture plane that trap at least a portion of the gaseous compounds; and
   separating the thin film from the substrate along the fracture plane.

8. The process for forming a thin film according to claim 7, wherein forming openings comprises forming a patterned layer on the substrate surface and etching the substrate using the patterned layer as an etch mask.

9. The process for forming a thin film according to claim 7 further comprising filling the openings with a material before introducing the gaseous compounds.

10. The process for forming a thin film according to claim 9, wherein filling the openings with a material comprises filling with a material having a parametric crystalline mismatch with the adjacent regions of the substrate.

11. The process for forming a thin film according to claim 7 further comprising applying a heat treatment to close at least a portion of the openings after introducing the gaseous compounds.

12. A process for forming a thin film comprising:
   providing a support having a silicon layer thereon;
   forming a patterned silicon nitride layer on the silicon layer;
   using the patterned silicon nitride layer to etch openings in the silicon layer to form a gaseous compound trap zone extending parallel to a surface of the substrate;
   after etching the openings, introducing gaseous compounds in the gaseous compound trap zone sufficient to form micro-cavities in a fracture plane therein,
   wherein the openings comprises inclusions in the fracture plane that trap at least a portion of the gaseous compounds; and
   separating the thin film from the substrate along the fracture plane.

13. The process for forming a thin film according to claim 12, wherein forming a patterned silicon nitride layer comprises forming a silicon nitride layer having openings of a first lateral dimension, and wherein the openings in the silicon layer are etched to have a second dimension larger than the first dimension.

14. The process for forming a thin film according to claim 13 further comprising filling the openings in the silicon layer with a material before introducing the gaseous compounds.

15. The process for forming a thin film according to claim 14, wherein filling the openings with a material comprises filling with a material having a parametric crystalline mismatch with the adjacent regions of the substrate.

16. The process for forming a thin film according to claim 14, wherein filling the openings in the silicon layer with a material comprises depositing titanium.

17. The process for forming a thin film according to claim 16, wherein introducing gaseous compounds comprises introducing oxygen.

18. The process for forming a thin film according to claim 12 further comprising applying a heat treatment to close at least a portion of the openings after introducing the gaseous compounds.

19. The process for forming a thin film according to claim 1, wherein etching cavities in the material layer comprises one of ionic etching, selective chemical etching, or electrochemical etching.

20. The process for forming a thin film according to claim 1, wherein the gaseous compound trap zone confines the gaseous compounds within a thin, disturbed layer that is thinner that obtained by introducing a dose of gaseous compounds in the absence of etching the cavities.

21. The process for forming a thin film according to claim 7, wherein etching openings in a surface of a substrate comprises one of ionic etching, selective chemical etching, or electrochemical etching.

22. The process for forming a thin film according to claim 7, wherein the gaseous compound trap zone confines the gaseous compounds within a thin, disturbed layer that is thinner than that obtained by introducing a dose of gaseous compounds in the absence of etching the openings.

23. The process for forming a thin film according to claim 12, wherein etch openings in the silicon layer comprises one of ionic etching, selective chemical etching, or electrochemical etching.

24. The process for forming a thin film according to claim 12, wherein the gaseous compound trap zone confines the gaseous compounds within a thin, disturbed layer that is thinner than that obtained by introducing a dose of gaseous compounds in the absence of etching the openings.

* * * * *